(12) United States Patent
Lee

(10) Patent No.: US 11,625,182 B2
(45) Date of Patent: Apr. 11, 2023

(54) STORAGE DEVICE AND OPERATING METHOD THEREOF

(71) Applicant: SK hynix Inc., Icheon-si (KR)

(72) Inventor: Wan Seob Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 34 days.

(21) Appl. No.: 17/193,904

(22) Filed: Mar. 5, 2021

(65) Prior Publication Data

US 2022/0066671 A1 Mar. 3, 2022

(30) Foreign Application Priority Data

Aug. 31, 2020 (KR) .......................... 10-2020-0110504

(51) Int. Cl.
*G11C 16/04* (2006.01)
*G06F 3/06* (2006.01)
*G11C 16/32* (2006.01)
*G11C 16/26* (2006.01)
*G11C 11/56* (2006.01)

(52) U.S. Cl.
CPC .......... *G06F 3/0644* (2013.01); *G06F 3/0604* (2013.01); *G06F 3/0673* (2013.01); *G11C 16/0483* (2013.01); *G11C 16/26* (2013.01); *G11C 16/32* (2013.01); *G11C 11/5621* (2013.01); *G11C 11/5671* (2013.01)

(58) Field of Classification Search
CPC .... G06F 3/0644; G06F 3/0604; G06F 3/0673; G06F 3/0658; G11C 16/0483; G11C 16/26; G11C 16/32; G11C 11/5621; G11C 11/5671; G11C 11/5642; G11C 7/106; G11C 7/22; G11C 8/12

USPC .......................................... 365/185.18, 230.06
See application file for complete search history.

(56) References Cited

U.S. PATENT DOCUMENTS

| 5,200,925 A * | 4/1993 | Morooka ............... G11C 7/103 365/219 |
| 5,517,155 A * | 5/1996 | Yamauchi ................. H03L 7/08 327/107 |
| 5,812,490 A * | 9/1998 | Tsukude .................... G11C 7/22 365/230.03 |
| 6,128,213 A * | 10/2000 | Kang ................... G11C 11/2293 365/185.23 |
| 6,185,151 B1 * | 2/2001 | Cho ...................... G11C 7/1072 365/189.16 |
| 6,256,234 B1 * | 7/2001 | Keeth .................. G11C 7/1078 365/208 |

(Continued)

FOREIGN PATENT DOCUMENTS

| KR | 1020150062434 A | 6/2015 |
| KR | 1020170075473 A | 7/2017 |

*Primary Examiner* — Michael T Tran
(74) *Attorney, Agent, or Firm* — William Park & Associates Ltd.

(57) ABSTRACT

The storage device includes a memory controller and a plurality of banks, each of the plurality of banks including a plurality of memory devices. Each of the plurality of memory devices includes: a data selector for selecting and outputting data of a memory device that is included in any one of the plurality of banks based on a bank select signal; a latch unit for storing the data that is output from the data selector; and a transmission control signal generator for generating the bank select signal such that the data that is stored in the latch unit is sequentially output.

18 Claims, 16 Drawing Sheets

(56) References Cited

U.S. PATENT DOCUMENTS

| | | | | |
|---|---|---|---|---|
| 6,307,410 B1* | 10/2001 | Matsui | | G11C 7/222 |
| | | | | 327/212 |
| 9,025,399 B1* | 5/2015 | Morris | | G06F 13/1689 |
| | | | | 365/191 |
| 10,546,645 B1* | 1/2020 | Gilliland | | G11C 16/08 |
| 11,182,110 B1* | 11/2021 | Ansari | | G06F 5/06 |
| 11,404,778 B2* | 8/2022 | Mertel | | H01Q 3/01 |
| 2001/0054164 A1* | 12/2001 | Tanizaki | | G11C 29/48 |
| | | | | 714/718 |
| 2002/0004922 A1* | 1/2002 | Manning | | G11C 7/1072 |
| | | | | 714/720 |
| 2003/0214979 A1* | 11/2003 | Kang | | H04L 12/40032 |
| | | | | 370/535 |
| 2005/0105331 A1* | 5/2005 | Lee | | G11C 16/22 |
| | | | | 365/185.11 |
| 2005/0219930 A1* | 10/2005 | Takahashi | | G11C 11/40615 |
| | | | | 365/222 |
| 2006/0034142 A1* | 2/2006 | Ooishi | | G11C 8/10 |
| | | | | 365/230.06 |
| 2006/0233012 A1* | 10/2006 | Sekiguchi | | G11C 5/02 |
| | | | | 365/51 |
| 2008/0089165 A1* | 4/2008 | Honda | | G11C 16/26 |
| | | | | 365/233.1 |
| 2013/0051145 A1* | 2/2013 | Ahn | | G11C 16/0483 |
| | | | | 365/185.11 |
| 2014/0022853 A1* | 1/2014 | Choi | | G11C 11/5642 |
| | | | | 365/189.05 |
| 2016/0179697 A1* | 6/2016 | Park | | G06F 12/0246 |
| | | | | 711/206 |
| 2017/0004869 A1* | 1/2017 | Shin | | G11C 11/4096 |
| 2018/0108425 A1* | 4/2018 | Lee | | G11C 7/20 |
| 2018/0166128 A1* | 6/2018 | Rawat | | G06F 13/1689 |
| 2018/0182462 A1* | 6/2018 | Ogawa | | G11C 16/32 |
| 2018/0277189 A1* | 9/2018 | Shimizu | | G11C 11/1653 |
| 2020/0082899 A1* | 3/2020 | Lee | | G11C 29/1201 |
| 2020/0135291 A1* | 4/2020 | Takahashi | | G11C 8/12 |
| 2020/0150967 A1* | 5/2020 | Ishii | | G06F 9/3806 |
| 2020/0411104 A1* | 12/2020 | Shin | | G11C 5/145 |
| 2021/0074365 A1* | 3/2021 | Dinh | | G11C 7/1042 |
| 2021/0192336 A1* | 6/2021 | Hanagandi | | G06F 9/544 |

* cited by examiner

STORAGE DEVICE AND OPERATING METHOD THEREOF

CROSS-REFERENCE TO RELATED APPLICATION

The present application claims priority under 35 U.S.C. § 119(a) to Korean patent application number 10-2020-0110504, filed on Aug. 31, 2020, in the Korean Intellectual Property Office, the entire disclosure of which is incorporated herein by reference.

BACKGROUND

1. Technical Field

The present disclosure generally relates to an electronic device, and more particularly, to a storage device and an operating method thereof.

2. Related Art

A storage device is a device configured to store data that is based on a host device, such as a computer, a smart phone or a smart pad. The storage device includes a device that is configured to store data on a magnetic disk, such as a Hard Disk Drive (HDD), and a device configured to store data in a semiconductor memory, particularly, a nonvolatile memory, such as a Solid State Drive (SSD) or a memory card.

The storage device may include a memory device that is configured to store data and a memory controller that is configured to control the memory device. The memory device is classified into a volatile memory device and a nonvolatile memory device. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

In accordance with an aspect of the present disclosure, there is provided a storage device with a memory controller and a plurality of banks, each of the plurality of banks including a plurality of memory devices, wherein each of the plurality of memory devices includes: a data selector configured to select and output data of a memory device that is included in any one of the plurality of banks based on a bank select signal; a latch unit configured to store the data that is output from the data selector; and a transmission control signal generator configured to generate the bank select signal such that the data that is stored in the latch unit is sequentially output.

In accordance with another aspect of the present disclosure, there is provided a method for operating a storage device with a memory controller and a plurality of banks, each of the plurality of banks including a plurality of memory devices, the method including: generating a bank select signal that controls a data selector which selects and outputs data of a memory device included in any one of the plurality of banks; and storing the data in a latch unit based on the bank select signal and then outputting the data to the memory controller.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Hereinafter, exemplary embodiments of the present disclosure will be described in detail with reference to the accompanying drawings in order for those skilled in the art to be able to readily implement the technical spirit of the present disclosure.

Embodiments provide a storage device capable of decreasing a transmission time and a current amount, which are consumed in data transmission, and an operating method of the storage device.

Figure 1:
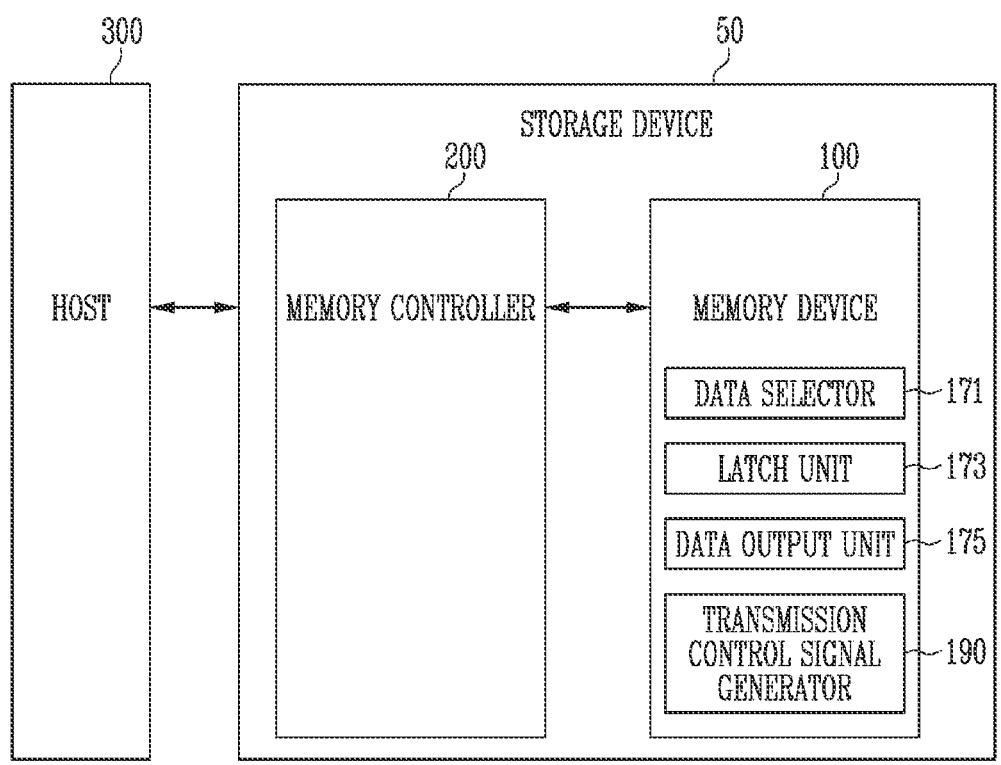
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be a device that stores data based on a host 300, such as a mobile phone, a smart phone, an MP3 player, a laptop computer, a desktop computer, a game console, a TV, a tablet PC or an in-vehicle infotainment.

The storage device 50 may be manufactured as any one of various types of storage devices based on a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types, such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

In an embodiment, the storage device 50 may include a plurality of banks. The plurality of banks may include a plurality of memory devices. Each of the plurality of banks may be connected to the memory controller 200 through a channel. That is, in a structure of the storage device 50 with a plurality of memory devices, each of the memory devices may belong to any one bank and may be connected to the memory controller 200 through a channel.

The memory device 100 may store data. The memory device 100 operates based on the memory controller 200. The memory device 100 may include a memory cell array with a plurality of memory cells that stores data. The memory cell array may include a plurality of memory blocks. Each memory block may include a plurality of memory cells, and the plurality of memory cells may constitute a plurality of pages. In an embodiment, the page may be a unit for storing data in the memory device 100 or reading data that is stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, the case in which the memory device 100 is a NAND flash memory is assumed and described.

In an embodiment, the memory device 100 may be implemented in a two-dimensional array structure or three-dimensional array structure. Hereinafter, although the case in which the memory device 100 is implemented in the three-dimensional array structure is described as an embodiment, the present disclosure is not limited to the three-dimensional array structure. The present disclosure may be applied to not only a flash memory device in which a charge storage layer configured with a Floating Gate (FG), but also a Charge Trap Flash (CTF) in which a charge storage layer is configured with an insulating layer.

In an embodiment, the memory device 100 may be operated by using a Single Level Cell (SLC) method in which one data bit is stored in one memory cell. Alternatively, the memory device 100 may be operated by using a method in which at least two data bits are stored in one memory cell. For example, the memory device 100 may be operated by using a Multi-Level Cell (MLC) method in which two data bits are stored in one memory cell, a Triple Level Cell (TLC) method in which three data bits are stored in one memory cell, or a Quadruple Level Cell (QLC) method in which four data bits are stored in one memory cell.

The memory device 100 may be configured to receive a command and an address from the memory controller 200 and may access an area that is selected by the address in the memory cell array. That is, the memory device 100 may perform an operation that corresponds to the command on the area that is selected by the address. For example, the memory device 100 may perform a write (program) operation, a read operation, and an erase operation based on the received command. For example, when a program command is received, the memory device 100 may program data in the area that is selected by the address. When a read command is received, the memory device 100 may read data from the area selected by the address. When an erase command is received, the memory device 100 may erase data that is stored in the area that is selected by the address.

In an embodiment, the memory device 100 may include a data selector 171, a latch unit 173, and a data output unit 175. The data selector 171, the latch unit 173, and the data output unit 175 may be connected to each other through a bus.

The data selector 171 may selectively output data that is received from a serializer based on a bank select signal. The serializer may be a device that controls data to be sequentially output.

The latch unit 173 may store the data that is output from the data selector 171, and the data that is stored in the latch unit 173 may be transferred to an input/output pin DQ through the data output unit 175 to be output to the memory controller 200. In a structure of a plurality of banks, some of the plurality of banks may share the latch unit 173 and the data output unit 175.

In an embodiment, the memory device 100 may transmit data to the memory controller 200 through three stages. That is, the data may be output to the memory controller 200 by undergoing three steps. The three steps may mean outputs of data in the data selector 171, the latch unit 173, and the data output unit 175.

For example, data that is stored in a memory cell array of the memory device 100 may be transferred to a serializer for sequentially outputting data, and data that is output from the serializer may be transferred from the data selector 171 to the latch unit 173 based on a bank select signal (a first stage). The data that is stored in the latch unit 173 may be transferred as input/output data to the data output unit 175 (a second stage). The data that is transferred to the data output unit 175 may be sequentially output to the memory controller 200 based on a received clock (a third stage).

However, since data is transferred through three stages, the current amount that is consumed by undergoing each stage may increase, and the output of data may be delayed.

Accordingly, in the present disclosure, a method for merging a plurality of stages is proposed so as to decrease the current amount that is consumed in the memory device 100 and to prevent the output delay of data.

In an embodiment, the memory device 100 may include a transmission control signal generator 190. The transmission control signal generator 190 may generate control signals that output data in a merged stage structure.

When data is output through three stages, the data are sequentially output based on an external clock. However, in the merged stage structure, data may be output based on only a bank select signal, and hence, it may be necessary to generate a bank select signal that outputs data in stages.

Therefore, the transmission control signal generator 190 may generate a bank select signal that outputs data in stages. In the merged stage structure, data may be sequentially output based on the bank select signal that is generated by the transmission control signal generator 190.

The memory controller 200 may control overall operations of the storage device 50.

When a power voltage is applied to the storage device 50, the memory controller 200 may execute firmware (FW). When the memory device 100 is a flash memory device, the memory controller 200 may execute FW, such as a Flash Translation Layer (FTL) that controls communication between the host 300 and the memory device 100.

In an embodiment, the memory controller 200 may include firmware (not shown) that receives data and a logical block address LBA from the host 300 and may translate the logical block address LBA into a physical block address PBA, representing addresses of memory cells that are included in the memory device 100, in which data is to be stored. Also, the memory controller 200 may store, in a buffer memory (not shown), a logical-physical address mapping table that establishes a mapping relationship between the logical block address LBA and the physical block address PBA.

The memory controller 200 may control the memory device 100 to perform a program operation, a read operation, an erase operation, or the like based on a request from the host 300. For example, when a program request is received from the host 300, the memory controller 200 may change the program request into a program command and may provide the memory device 100 with the program command, a physical block address PBA, and data. When a read request is received together with a logical block address LBA from the host 300, the memory controller 200 may change the read request into a read command, may select a physical block address PBA corresponding to the logical block address LBA, and then may provide the memory device 100 with the read command and the physical block address PBA. When an erase request is received together with a logical block address LBA from the host 300, the memory controller 200 may change the erase request into an erase command, may select a physical block address PBA that corresponds to the logical block address LBA, and then may provide the memory device 100 with the erase command and the physical block address PBA.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations, such as a program operation for wear leveling and a program operation for garbage collection.

In an embodiment, the storage device 50 may further include the buffer memory (not shown). The memory controller 200 may control data exchange between the host 300 and the buffer memory. Alternatively, the memory controller 200 may temporarily store system data that controls the memory device 100 in the buffer memory. For example, the memory controller 200 may temporarily store data that is input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands that are executed by the memory controller 200. Alternatively, the buffer memory may store data that is processed by the memory controller 200.

In an embodiment, the buffer memory may be implemented with a Dynamic Random Access Memory (DRAM), such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the buffer memory may be externally connected to the storage device 50. Therefore, volatile memory devices that are externally connected to the storage device 50 may perform functions of the buffer memory.

In an embodiment, the memory controller 200 may control at least two memory devices. The memory controller 200 may control the memory devices based on an interleaving technique so as to improve operational performance.

The host 300 may communicate with the storage device 50, by using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
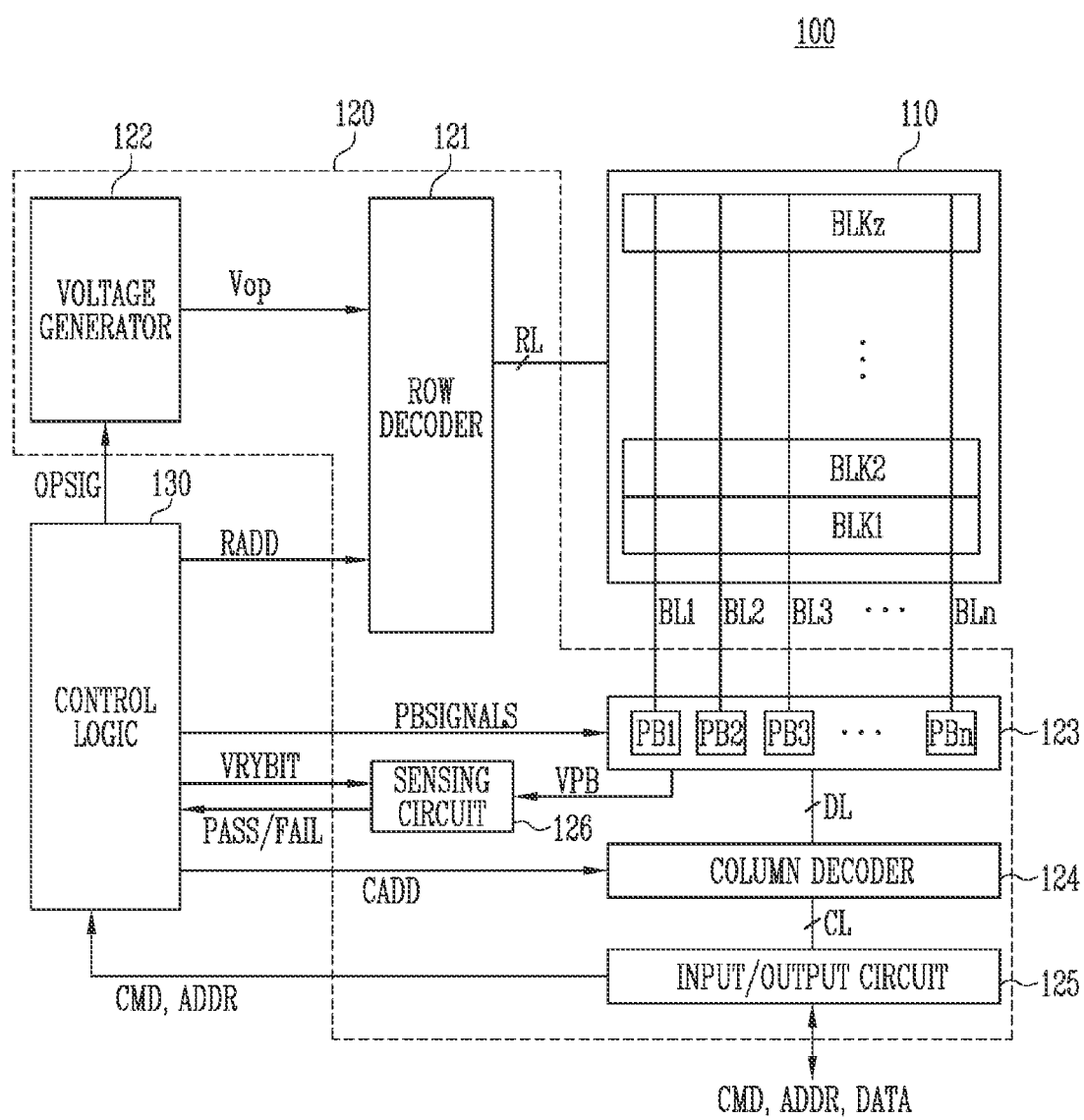
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 100, a peripheral circuit 120, and a control logic 130.

The memory cell array 110 may include a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLn. Each of the plurality of memory blocks BLK1 to BLKz may include a plurality of memory cells. In an embodiment, the plurality of memory cells may be nonvolatile memory cells. Memory cells that are connected to the same word line may be defined as one page. Therefore, one memory block may include a plurality of pages.

The row lines RL may include at least one source select line, a plurality of word lines, and at least one drain select line.

Each of the memory cells that is included in the memory cell array 110 may be configured as a Single Level Cell (SLC) that stores one data bit, a Multi-Level Cell (MLC) that stores two data bits, a Triple Level Cell (TLC) that stores three data bits, or a Quadruple Level Cell (QLC) that stores four data bits.

The peripheral circuit 120 may perform a program operation, a read operation, or an erase operation on a selected region of the memory cell array 110 based on the control logic 130. The peripheral circuit 120 may drive the memory cell array 110. For example, the peripheral circuit 120 may apply various operating voltages to the row lines RL and the bit lines BL1 to BLn or may discharge the applied voltages based on the control logic 130.

The peripheral circuit 120 may include the row decoder 121, the voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD that is received from the control logic 130. The row decoder 121 selects at least one memory block among the memory blocks BLK1 to BLKz based on the decoded address. Also, the row decoder 121 may select at least one word line of the selected memory block to apply voltages that are generated by the voltage generator 122 to the at least one word line WL based on the decoded address.

For example, in a program operation, the row decoder 121 may apply a program voltage to the selected word line and may apply a program pass voltage with a level that is lower than that of the program voltage to unselected word lines. In a program verify operation, the row decoder 121 may apply a verify voltage to the selected word line and may apply a verify pass voltage with a level higher than that of the verify voltage to the unselected word lines.

In a read operation, the row decoder 121 may apply a read voltage to the selected word line, and apply a read pass voltage with a level higher than that of the read voltage to the unselected word lines.

In an embodiment, an erase operation of the memory device 100 may be performed in a memory block. In the erase operation, the row decoder 121 may select one memory block based on the decoded address. In the erase operation, the row decoder 121 may apply a ground voltage to word lines connected to the selected memory blocks.

The voltage generator 122 operates based on the control logic 130. The voltage generator 122 generates a plurality of voltages by using an external power voltage supplied to the memory device 100. Specifically, the voltage generator may generate various operating voltages Vop used in program, read, and erase operations based on an operation signal OPSIG. For example, the voltage generator 122 may generate a program voltage, a verify voltage, a pass voltage, a read voltage, an erased voltage, and the like based on the control logic 130.

In an embodiment, the voltage generator 122 may generate an internal power voltage by regulating the external power voltage. The internal power voltage that is generated by the voltage generator 122 may be used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors based on the control logic 130.

The plurality of generated voltages may be supplied to the memory cell array 110 by the row decoder 121.

The page buffer group 123 may include first to nth page buffers PB1 to PBn. The first to nth page buffers PB1 to PBn are connected to the memory cell array 110 respectively through first to nth bit lines BL1 to BLn. The first to nth bit lines BL1 to BLn operate based on the control logic 130. Specifically, the first to nth bit lines BL1 to BLn may operate based on page buffer control signals PBSIGNALS. For example, the first to nth page buffers PB1 to PBn may temporarily store data that is received through the first to nth bit lines BL1 to BLn, or sense a voltage or current of the bit lines BL1 to BLn in a read or verify operation.

Specifically, in a program operation, the first to nth page buffers PB1 to PBn may transfer data DATA that is received through the input/output circuit 125 to selected memory cells through the first to nth bit lines BL1 to BLn, when a program voltage is applied to a selected word line. Memory cells of a selected page are programmed based on the transferred data DATA. In a program verify operation, the first to nth page buffers PB1 to PBn read page data by sensing a voltage or current received from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 based on the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 based on a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller (200 shown in FIG. 1), to the control logic 130, or exchange data DATA with the column decoder 124.

In a read operation or verify operation, the sensing circuit 125 may generate a reference current based on an allow bit VRYBIT signal and may output a pass or fail signal PASS/FAIL by comparing a sensing voltage VPB that is received from the page buffer group 123 and a reference voltage that is generated by the reference current.

The control logic 130 may control the peripheral circuit 120 by outputting the operation signal OPSIG, the row address RADD, the page buffer control signals PBSIGNALS, and the allow bit VRYBIT based on the command CMD and the address ADDR. For example, the control logic 130 may control a read operation of a selected memory block based on a sub-block read command and an address. Also, the control logic 130 may control an erase operation of a selected sub-block included in the selected memory block based on a sub-block erase command and an address. Also, the control logic 130 may determine whether the verify operation has passed or failed based on the pass or fail signal PASS or FAIL.

Figure 3:
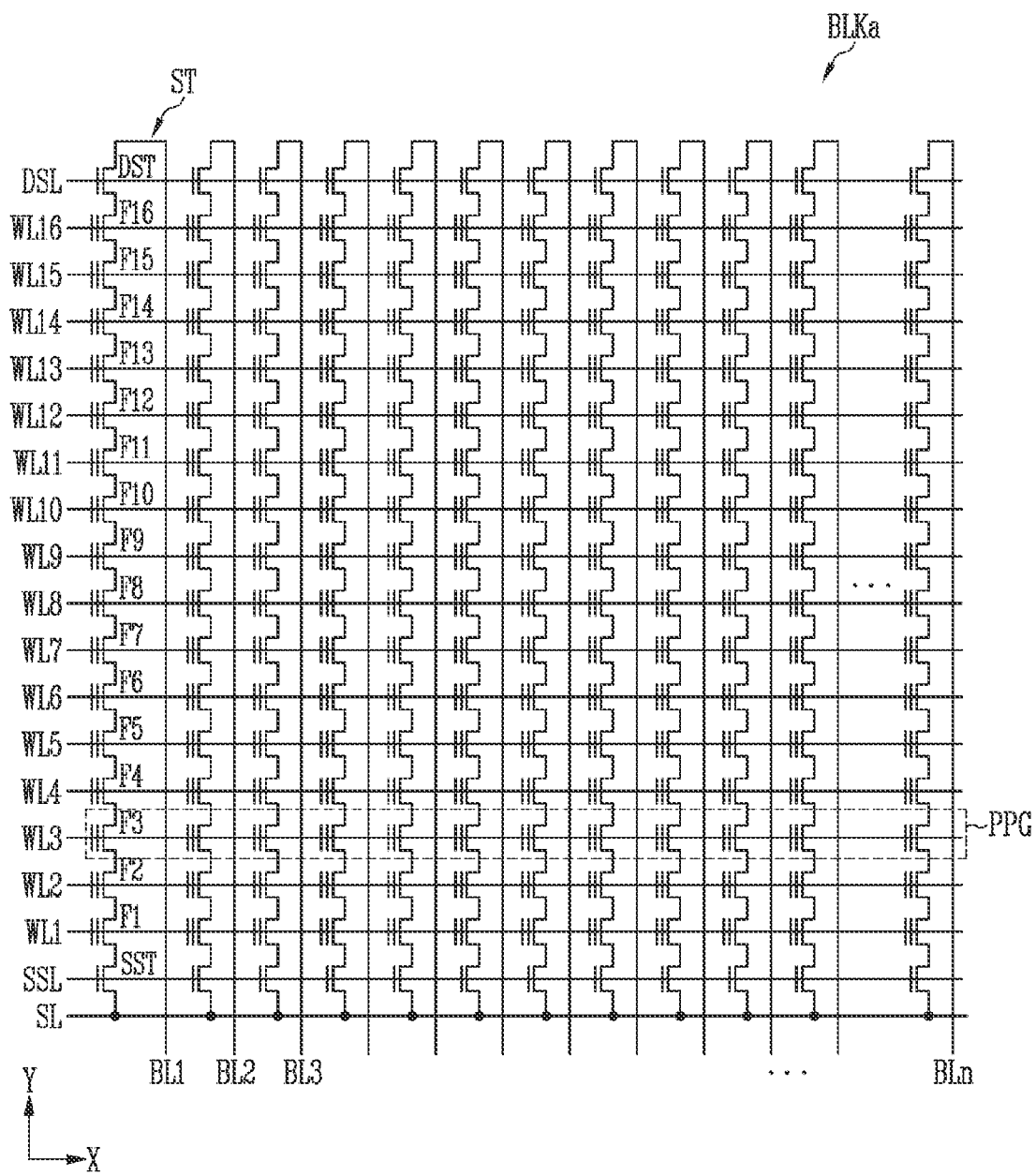
FIG. 3 is a diagram illustrating an embodiment of a memory cell array shown in FIG. 2.

FIG. 3 is a diagram illustrating an embodiment of the memory cell array shown in FIG. 2.

Referring to FIGS. 2 and 3, FIG. 3 is a circuit diagram illustrating any one memory block BLKa among the plurality of memory blocks BLK1 to BLKz included in the memory cell array 110 shown in FIG. 2.

In the memory block BLKa, a first select line, word lines, and a second select line, which are arranged in parallel, may be connected to each other. For example, the word lines may be arranged in parallel between the first and second select lines. The first select line may be a source select line SSL, and the second select line may be a drain select line DSL.

More specifically, the memory block BLKa may include a plurality of strings that are connected between bit lines BL1 to BLn and a source line SL. The bit lines BL1 to BLn may be respectively connected to the strings, and the source line SL may be commonly connected to the strings. The strings may be configured identically to one another, and therefore, a string ST that is connected to a first bit line BL1 will be described in detail as an example.

The string ST may include a source select transistor SST, a plurality of memory cells F1 to F16, and a drain select transistor DAT, which are connected in series to each other between the source line SL and the first bit line BL1. At least one source select transistor SST and at least one drain select transistor DST may be included in one string ST, and memory cells, the number of which is greater than that of the memory cells F1 to F16, shown in the drawing, may be included in the one string ST.

The source of the source select transistor SST may be connected to the source line SL, and a drain of the drain select transistor DAT may be connected to the first bit line BL1. The memory cells F1 to F16 may be connected in series between the source select transistor SST and the drain select transistor DST. Gates of source select transistors SST included in different strings may be connected to the source select line SSL, and gates of drain select transistors DST included in different strings may be connected to the drain select line DSL. Gates of the memory cells F1 to F116 may be connected to a plurality of word lines WL1 to WL16. A group of memory cells that is connected to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PG may store one logical page (LPG) data. The one LPG data may include data bits of which the number corresponds to that of cells that are included in one physical page PPG. Alternately, one memory cell MC may store data of two or more bits. The memory cell is generally referred to as a multi-level cell (MLC). One physical page PPG may store two or more LPG data.

A memory cell that stores data of two or more bits is referred to as the MLC. As the number of bits of data that is stored in one memory cell increases, the MLC has recently meant as a memory cell that stores data of two bits. A memory cell that stores data of three or more bits is referred to as a triple level cell (TLC), and a memory cell that stores data of four or more bits is referred to as a quadruple level cell (QLC). Besides, memory cells that stores data of a plurality of bits have been developed, and this embodiment may be applied to memory systems in which data of two or more bits are stored.

In another embodiment, each of the plurality of memory blocks may have a three-dimensional structure. Each memory block may include a plurality of memory cells that are stacked on a substrate. The plurality of memory cells may be arranged along +X, +Y, and +Z directions.

Figure 4:
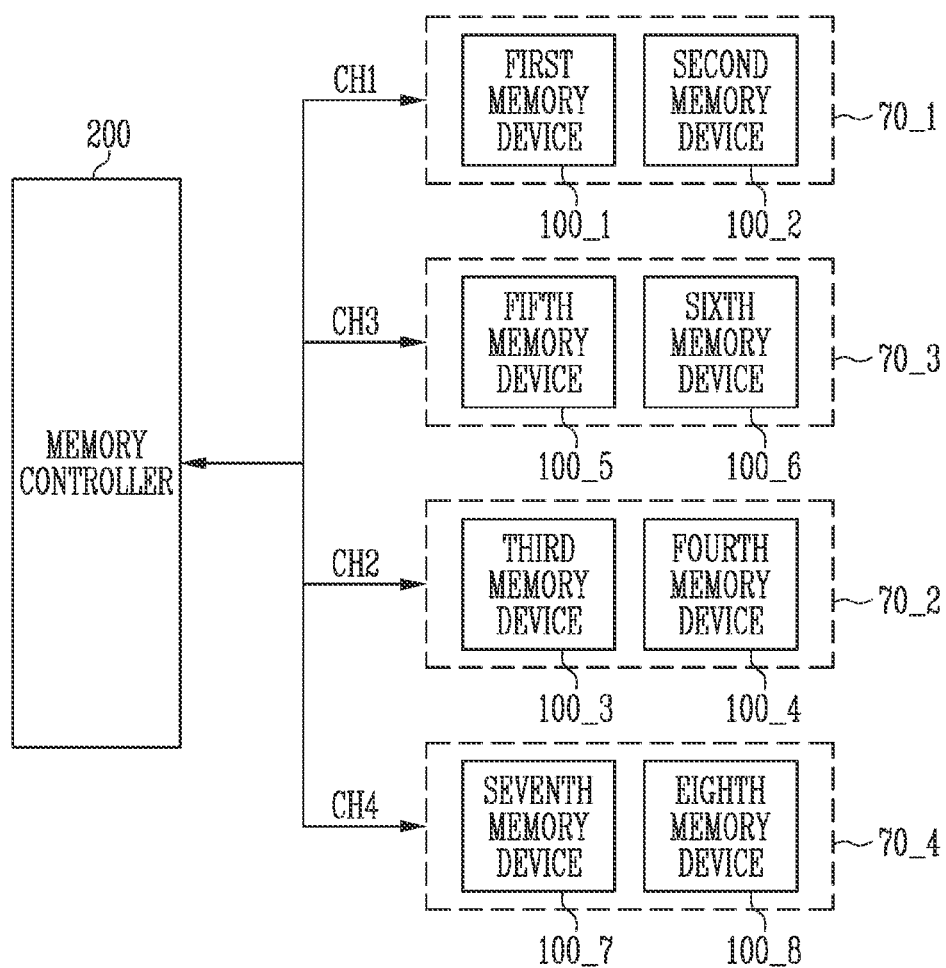
FIG. 4 is a diagram illustrating a structure in which a plurality of banks are connected to a memory controller.

FIG. 4 is a diagram illustrating a structure in which a plurality of banks are connected to a memory controller.

Referring to FIG. 4, FIG. 4 illustrates a structure of the storage device (50 shown in FIG. 1) that includes a plurality of banks. First to fourth banks 70_1 to 70_4 shown in FIG. 4 may be connected to the memory controller 200 through first to fourth channels CH1 to CH4. That is, memory devices that are respectively included in the first to fourth banks 70_1 to 70_4 may communicate with the memory controller 200 through the first to fourth channels CH1 to CH4.

In an embodiment, each of the first to fourth banks 70_1 to 70_4 may include a plurality of memory devices. The plurality of memory devices may store data or output stored data.

For example, the first bank 70_1 may include first and second memory devices 100_1 and 100_2, the second bank 70_2 may include third and fourth memory devices 100_3 and 100_4, the third bank 70_3 may include fifth and sixth memory devices 100_5 and 100_7, and the fourth bank 70_4 may include seventh and eighth memory devices 100_7 and 100_8.

Although the case in which each bank includes two memory devices is illustrated in FIG. 4, each bank may include one memory device or three or more memory devices. In addition, numbers of memory devices included in the respective banks may be different from each other.

In an embodiment, data that is stored in the first to fourth banks 70_1 to 70_4 may be output to the memory controller 200 through the first to fourth channels CH1 to CH4. Data that is stored in the first bank 70_1 may be output through the first channel CH1, data that is stored in the second bank 70_2 may be output through the second channel CH2, data that is stored in the third bank 70_3 may be output through the third channel CH3, and data that is stored in the fourth bank 70_4 may be output through the fourth channel CH4.

In an embodiment, since data that is stored in the first to fourth bank 70_1 to 70_4 cannot be simultaneously output to the memory controller 200, the data that is stored in the first to fourth bank 70_1 to 70_4 may be sequentially output to the memory controller 200 through three stages.

First, data that is respectively stored in the first to eighth memory devices 100_1 to 100_8 included in the first to fourth bank 70_1 to 70_4 may be output to a latch unit based on a bank select signal (a first stage). The data that is stored in the latch unit may be transferred as input/output data to a data output unit (a second stage), the data that transferred to the data output unit may output to the memory controller 200 in synchronization with a clock signal (a third stage).

However, the current amount that is consumed in a process of transmitting data through a plurality of stages increases. In addition, data may be transmitted through the plurality of stages, and therefore, a transmission delay may be problematic.

Accordingly, in the present disclosure, a method for merging the above-described stages is proposed.

Figure 5:
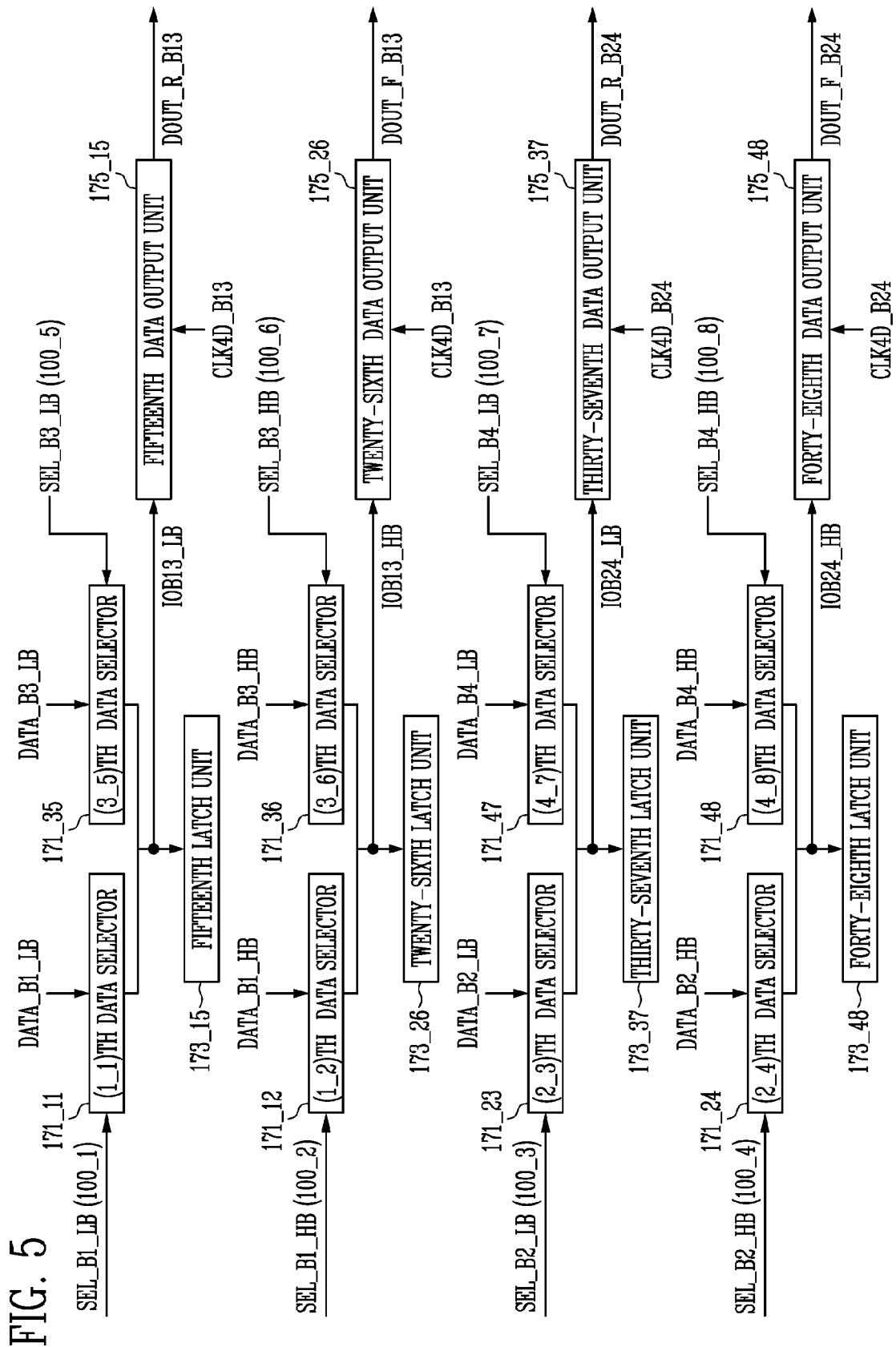
FIG. 5 is a diagram illustrating a process of outputting data through three stages.

FIG. 5 is a diagram illustrating a process of outputting data through three stages.

Referring to FIGS. 4 and 5, FIG. 5 illustrates a process of outputting data that is stored in the first to fourth banks (70_1 to 70_4 shown in FIG. 4). That is, FIG. 5 illustrates a process of outputting data store in the first to eighth memory devices (100_1 to 100_8 shown in FIG. 4). The data that is stored in the first to eighth memory devices (100_1 to 100_8 shown in FIG. 4) may be output through three stages. The three stages may mean outputs of data in a data selector, a latch unit, and a data output unit.

In FIG. 5, the data selector may be configured as an amplifier, the latch unit may be configured as a latch circuit with an inverter (NOT gate), and the data output unit may be configured as a D flip-flop.

In an embodiment, first bank low bit data DATA_B1_LB may mean data that is output from a serializer of the first memory device (100_1 shown in FIG. 4) that is included in the first bank (70_1 shown in FIG. 4), and first bank high bit data DATA_B1_HB may mean data that is output from a serializer of the second memory device (100_2 shown in FIG. 4) that is included in the first bank (70_1 shown in FIG. 4). The serializer may be a device which controls data to be sequentially output.

Second bank low bit data DATA_B2_LB may mean data that is output from a serializer of the third memory device (100_3 shown in FIG. 4) that is included in the second bank (70_2 shown in FIG. 4), and second bank high bit data DATA_B2_HB may mean data that is output from a serializer of the fourth memory device (100_4 shown in FIG. 4) that is included in the second bank (70_2 shown in FIG. 4).

Third bank low bit data DATA_B3_LB may mean data that is output from a serializer of the fifth memory device (100_5 shown in FIG. 4) that is included in the third bank (70_3 shown in FIG. 4), and third bank high bit data DATA_B3_HB may mean data that is output from a serializer of the sixth memory device (100_6 shown in FIG. 4) that is included in the third bank (70_3 shown in FIG. 4).

Fourth bank low bit data DATA_B4_LB may mean data that is output from a serializer of the seventh memory device (100_7 shown in FIG. 4) that is included in the fourth bank (70_4 shown in FIG. 4), and fourth bank high bit data DATA_B4_HB may mean data that is output from a serializer of the eighth memory device (100_8 shown in FIG. 4) that is included in the fourth bank (70_4 shown in FIG. 4).

In an embodiment, the first bank low bit data DATA_B1_LB may be output based on a first bank low select signal SEL_B1_LB, and the first bank high bit data DATA_B1_HB may be output based on a first bank high select signal SEL_B1_HB. In addition, the second bank low bit data DATA_B2_LB may be output based on a second bank low select signal SEL_B2_LB, and the second bank high bit data DATA_B2_HB may be output based on a second bank high select signal SEL_B2_HB. The third bank low bit data DATA_B3_LB may be output based on a third bank low select signal SEL_B3_LB, and the third bank high bit data DATA_B3_HB may be output based on a third bank high select signal SEL_B3_HB. In addition, the fourth bank low bit data DATA_B4_LB may be output based on a fourth bank low select signal SEL_B4_LB, and the fourth bank high bit data DATA_B4_HB may be output based on a fourth bank high select signal SEL_B3_HB.

The first bank low select signal SEL_B1_LB may correspond to the first memory device (100_1 shown in FIG. 4), the first bank high select signal SEL_B1_HB may correspond to the second memory device (100_2 shown in FIG. 4), the second bank low select signal SEL_B2_LB may correspond to the third memory device (100_3 shown in FIG. 4), the second bank high select signal SEL_B2_HB may correspond to the fourth memory device (100_4 shown in FIG. 4), the third bank low select signal SEL_B3_LB may correspond to the fifth memory device (100_5 shown in FIG. 4), the third bank high select signal SEL_B3_HB may correspond to the sixth memory device (100_6 shown in FIG. 4), the fourth bank low select signal SEL_B4_LB may correspond to the seventh memory device (100_7 shown in FIG. 4), and the fourth bank high select signal SEL_B4_LB may correspond to the eighth memory device (100_8 shown in FIG. 4).

For example, when the first bank low select signal SEL_B1_LB in a high state is received, a (1_1)th data selector 171_11 may output the first bank low bit data DATA_B1_LB to a fifteenth latch unit 173_15. When the first bank high select signal SEL_B1_HB in a high state is received, a (1_2)th data selector 171_12 may output the first bank high bit data DATA_B1_HB to a twenty-sixth latch unit 173_26.

In addition, when the second bank low select signal SEL_B2_LB in a high state is received, a (2_3)th data selector 171_23 may output the second bank low bit data DATA_B2_LB to a thirty-seventh latch unit 173_37. When the second bank high select signal SEL_B2_HB in a high state is received, a (2_4)th data selector 171_24 may output the second bank high bit data DATA_B2_HB to a forty-eighth latch unit 173_48.

When the third bank low select signal SEL_B3_LB in a high state is received, a (3_5)th data selector 171_35 may output the third bank low bit data DATA_B3_LB to the fifteenth latch unit 173_15. When the third bank high select signal SEL_B3_HB in a high state is received, a (3_6)th data selector 171_36 may output the third bank high bit data DATA_B3_HB to the twenty-sixth latch unit 173_26.

In addition, when the fourth bank low select signal SEL_B4_LB in a high state is received, a (4_7)th data selector 171_47 may output the fourth bank low bit data DATA_B4_LB to the thirty-seventh latch unit 173_37. When the fourth bank high select signal SEL_B4_HB in a high state is received, a (4_8)th data selector 171_48 may output the fourth bank high bit data DATA_B4_HB to the forty-eighth latch unit 173_48.

In FIG. 5, since the first and third banks (70_1 and 70_3 shown in FIG. 4) share the latch unit and the data output unit, any one of the (1_1)th data selector 171_11 and the (3_5)th data selector 17_35 is selected, so that the first bank low bit data DATA_B1_LB or the third bank low bit data DATA_B3_LB can be output to the fifteenth latch unit 173_15. The first bank low select signal SEL_B1_LB and the third bank low select signal SEL_B3_LB cannot be simultaneously in a high state. That is, since only any one of the first bank low bit data DATA_B1_LB and the third bank low bit data DATA_B3_LB can be output, the first bank low select signal SEL_B1_LB and the third bank low select signal SEL_B3_LB cannot be simultaneously in a high state.

As above, any one of the (1_2)th data selector 171_12 and the (3_6)th data selector 171_36 may be selected so that the first bank high bit data DATA_B1_HB or the third bank high bit data DATA_B3_HB may be output to the twenty-sixth latch unit 173_26. The first bank high select signal SEL_B1_HB and the third bank high select signal SEL_B3_HB cannot be simultaneously in a high state. That is, since only any one of the first bank high bit data DATA_B1_HB and the third bank high bit data DATA_B3_HB can be output, the first bank high select signal SEL_B1_HB and the third bank high select signal SEL_B3_HB cannot be simultaneously in a high state.

In FIG. 5, since the second and fourth banks (70_2 and 70_4 shown in FIG. 4) share the latch unit and the data output unit, any one of the (2_3)th data selector 171_23 and the (4_7)th data selector 17_47 may be selected so that the second bank low bit data DATA_B2_LB or the fourth bank low bit data DATA_B4_LB can be output to the thirty-seventh latch unit 173_37. The second bank low select signal SEL_B2_LB and the fourth bank low select signal SEL_B4_LB cannot be simultaneously in a high state. That is, since only any one of the second bank low bit data DATA_B2_LB and the fourth bank low bit data DATA_B4_LB can be output, the second bank low select signal SEL_B2_LB and the fourth bank low select signal SEL_B4_LB cannot be simultaneously in a high state.

As above, any one of the (2_4)th data selector 171_24 and the (4_8)th data selector 171_48 is selected, so that the second bank high bit data DATA_B2_HB or the fourth bank high bit data DATA_B4_HB can be output to the forty-eighth latch unit 173_48. The second bank high select signal SEL_B2_HB and the fourth bank high select signal SEL_B4_HB cannot be simultaneously in a high state. That is, since only any one of the second bank high bit data DATA_B2_HB and the fourth bank high bit data DATA_B4_HB can be output, the second bank high select signal SEL_B2_HB and the fourth bank high select signal SEL_B4_HB cannot be simultaneously in a high state.

As described above, that data selected based on a bank low select signal or a bank high select signal is output to the latch unit may correspond to a first stage among the three stages.

After the first stage, data that is stored in the fifteenth latch unit 173_15, the twenty-sixth latch unit 173_26, the thirty-seventh latch unit 173_37, and the forty-eighth latch unit 173_48 are respectively input/output data, and may respectively output thirteenth low bit data IOB13_LB, thirteenth high bit data IOB13_HB, twenty-fourth low bit data IOB24_LB, and twenty-fourth high bit data IOB24_HB to data output units. That data that is stored in the latch units are respectively output to the data output units may correspond to a second stage among the three stages.

After the second stage, a fifteenth data output unit 175_15 may output thirteenth reference output data DOUT_R_B13 based on the thirteenth low bit data IOB13_LB and a B13 clock CLK4D_B13, a twenty-sixth data output unit 175_26 may output thirteenth feedback output data DOUT_F_B13 based on the thirteenth high bit data IOB13_HB and the B13 clock CLK4D_B13, a thirty-seventh data output unit 175_37 may output twenty-fourth reference output data DOUT_R_B24 based on the twenty-fourth low bit data IOB24_LB and a B24 clock CLK4D_B24, and a forty-eighth data output unit 175_48 may output twenty-fourth feedback output data DOUT_F_B24 based on the twenty-fourth high bit data IOB24_HB and the B24 clock CLK4D_B24.

That is, since data that is output from the respective memory device are to be sequentially output to the memory controller (200 shown in FIG. 4), the fifteenth data output unit 175_15, the twenty-sixth data output unit 175_26, the thirty-seventh data output unit 175_37, and the forty-eighth data output unit 175_48 may sequentially output respectively data, based on a clock signal. That data is output to each data output unit may correspond to a third stage among the three stages.

Data that is stored in the first to fourth banks (70_1 to 70_4 shown in FIG. 4) through the first to third stages may be sequentially output to the memory controller (200 shown in FIG. 4).

Figure 6:
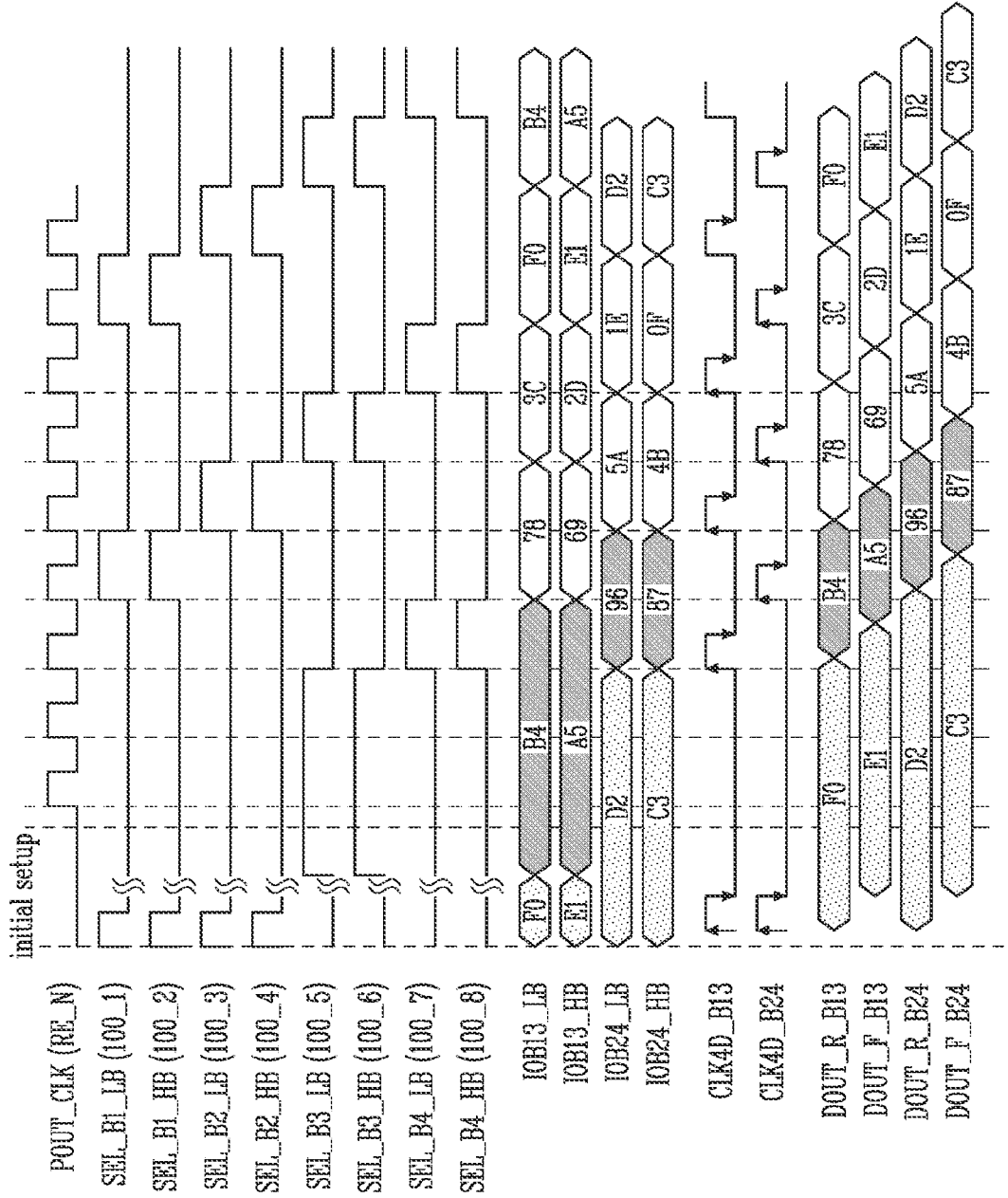
FIG. 6 is a diagram illustrating signals and clocks that control data to be output through three stages.

FIG. 6 is a diagram illustrating signals and clocks, which control data to be output through three stages.

Referring to FIGS. 5 and 6, FIG. 6 illustrates a state of each signal and output data, when data are output from the data selector, the latch unit, and the data output unit, which are shown in FIG. 5. In FIG. 6, it is assumed that each of the first bank low select signal SEL_B1_LB and the first bank high select signal SEL_B1_HB, the second bank low select signal SEL_B2_LB and the second bank high select signal SEL_B2_HB, the third bank low select signal SEL_B3_LB and the third bank high select signal SEL_B3_HB, and the fourth bank low select signal SEL_B4_LB and the fourth bank high select signal SEL_B4_HB are in the same state. That is, since select signals are divided for each bank, it is assumed that both the signals SEL_B1_LB and SEL_B1_HB corresponding to the first bank are in the same state, both the signals SEL_B2_LB and SEL_B2_HB corresponding to the second bank are in the same state, both the signals SEL_B3_LB and SEL_B3_HB corresponding to the third bank are in the same state, and both the signals SEL_B4_LB and SEL_B4_HB corresponding to the fourth bank are in the same state. The first bank low select signal SEL_B1_LB may correspond to the first memory device (100_1 shown in FIG. 4), the first bank high select signal SEL_B1_HB may correspond to the second memory device (100_2 shown in FIG. 4), the second bank low select signal SEL_B2_LB may correspond to the third memory device (100_3 shown in FIG. 4), the second bank high select signal SEL_B2_HB may correspond to the fourth memory device (100_4 shown in FIG. 4), the third bank low select signal SEL_B3_LB may correspond to the fifth memory device (100_5 shown in FIG. 4), the third bank high select signal SEL_B3_HB may correspond to the sixth memory device (100_6 shown in FIG. 4), the fourth bank low select signal SEL_B4_LB may correspond to the seventh memory device (100_7 shown in FIG. 4), and the fourth bank high select signal SEL_B4_HB may correspond to the eighth memory device (100_8 shown in FIG. 4).

In an embodiment, in an initial setup, the first bank low select signal SEL_B1_LB and the first bank high select signal SEL_B1_HB may be in a high state. Therefore, the (1_1)th data selector 171_11 may output and store the first bank low bit data DATA_B1_LB in the fifteenth latch unit 173_15 based on the first bank low select signal SEL_B1_LB in a high state. In addition, the (1_2)th data selector 171_12 may output and store the first bank high bit data DATA_B1_HB in the twenty-sixth latch unit 173_26 based on the first bank high select signal SEL_B1_HB in a high state.

As above, in the initial setup, the second bank low select signal SEL_B2_LB and the second bank high select signal SEL_B2_HB may be in a high state. Therefore, the (2_3)th data selector 171_23 may output and store the second bank low bit data DATA_B2_LB in the thirty-seventh latch unit 173_37 based on the second bank low select signal SEL_B2_LB in a high state. In addition, the (2_4)th data selector 171_24 may output and store the second bank high bit data DATA_B2_HB in the forty-eighth latch unit 173_48 based on the second bank high select signal SEL_B2_HB in a high state.

In an embodiment, since the first bank low select signal SEL_B1_LB, the first bank high select signal SEL_B1_HB, the second bank low select signal SEL_B2_LB, and the second bank high select signal SEL_B2_HB are in a high state, the third bank low select signal SEL_B3_LB, the third bank high select signal SEL_B3_HB, the fourth bank low select signal SEL_B4_LB, and the fourth bank high select signal SEL_B4_HB may be in a low state.

That is, since the (1_1)th data selector 171_11 is selected from the (1_1)th data selector 171_11 and the (3_5)th data selector 171_35, the third bank low select signal SEL_B3_LB may be in a low state. Similarly, since the (1_2)th data selector 171_12 is selected from the (1_2)th data selector 171_12 and the (3_6)th data selector 171_36, the third bank high select signal SEL_B3_HB may be in a low state. In addition, since the (2_3)th data selector 171_23 is selected from the (2_3)th data selector 171_23 and the (4_7)th data selector 171_47, the fourth bank low select signal SEL_B4_LB may be in a low state. Similarly, since the (2_4)th data selector 171_24 is selected from the (2_4)th data selector 171_24 and the (4_8)th data selector 171_48, the fourth bank high select signal SEL_B4_HB may be in a low state.

Since the (1_1)th data selector 171_11 is selected, the first bank low bit data DATA_B1_LB stored in the fifteenth latch unit 173_15 may be output as the thirteenth low bit data IOB13_LB through a bus, and 'F0' may be output to the fifteenth data output unit 175_15. Similarly, since the (1_2)th data selector 171_12 is selected, the first bank high bit data DATA_B1_HB that is stored in the twenty-sixth latch unit 173_26 may be output as the thirteenth high bit data IOB13_HB through the bus, and 'E1' may be output to the twenty-sixth data output unit 175_26. In addition, since the (2_3)th data selector 171_23 is selected, the second bank low bit data DATA_B2_LB stored in the thirty-seventh latch unit 173_37 may be output as the twenty-fourth low bit data IOB24_LB through the bus, and 'D2' may be output to the thirty-seventh data output unit 175_37. Similarly, since the (2_4)th data selector 171_24 is selected, the second bank high bit data DATA_B2_HB that is stored in the forty-eighth latch unit 173_48 may be output as the twenty-fourth high bit data IOB24_HB through the bus, and 'C3' may be output to the forty-eighth data output unit 175_48.

Subsequently, the fifteenth data output unit 175_15 may output 'F0' as the thirteenth reference output data DOUT_R_B13 when the B13 clock CLK4D_B13 is changed from a low state to a high state, and the twenty-sixth data output unit 175_26 may output 'E1' as the thirteenth feedback output data DOUT_F_B13 when the B13 clock CLK4D_B13 is changed from a high state to a low state. In addition, the thirty-seventh data output unit 175_37 may output 'D2' as the twenty-fourth reference output data DOUT_R_B24 when the B24 clock CLK4D_B24 is changed from a low state to a high state, and the forty-eighth data output unit 175_48 may output 'C3' as the twenty-fourth feedback output data DOUT_F_B24 when the B24 clock CLK4D_B24 is changed from a high state to a low state. Therefore, the fifteenth data output unit 175_15, the twenty-sixth data output unit 175_26, the thirty-seventh data output unit 175_37, and the forty-eighth data output unit 175 48 may sequentially output data to the memory controller.

In an embodiment, the (3_5)th data selector 171_35 may be selected from the (1_1)th data selector 171_11 and the (3_5)th data selector 171_35, and the (3_6)th data selector 171_36 may be selected from the (1_2)th data selector 171_12 and the (3_6)th data selector 171_36. The third bank low select signal SEL_B3_LB and the third bank high select signal SEL_B3_HB may be in a high state, and the first bank low select signal SEL_B1_LB and the first bank high select signal SEL_B1_HB may be in a low state.

Since the (3_5)th data selector 171_35 is selected, the third bank low bit data DATA_B3_LB stored in the fifteenth latch unit 173_15 may be output as the thirteenth low bit data IOB13_LB through the bus, and 'B4' may be output to the fifteenth data output unit 175_15. Similarly, since the (3_6)th data selector 171_36 is selected, the third bank high bit data DATA_B3_HB that is stored in the twenty-sixth latch unit 173_26 may be output as the thirteenth high bit data IOB13_HB through the bus, and 'A5' may be output to the twenty-sixth data output unit 175_26.

In an embodiment, the (4_7)th data selector 171_47 may be selected from the (2_3)th data selector 171_23 and the (4_7)th data selector 171_47, and the (4_8)th data selector 171_48 may be selected from the (2_4)th data selector 171_24 and the (4_8)th data selector 171_48. The fourth bank low select signal SEL_B4_LB and the fourth bank high select signal SEL_B4_HB may be in a high state, and the second bank low select signal SEL_B2_LB and the second bank high select signal SEL_B2_HB may be in a low state.

Since the (4_7)th data selector 171_47 is selected, the fourth bank low bit data DATA_B4_LB stored in the thirty-seventh latch unit 173_37 may be output as the twenty-fourth low bit data IOB243_LB through the bus, and '96' may be output to the thirty-seventh data output unit 175_37. Similarly, since the (4_8)th data selector 171_48 is selected, the fourth bank high bit data DATA_B4_HB that is stored in the forty-eighth latch unit 173_48 may be output as the twenty-fourth high bit data IOB24_HB through the bus, and '87' may be output to the forty-eighth data output unit 175_48.

Subsequently, the fifteenth data output unit 175_15 may output 'B4' as the thirteenth reference output data DOUT_R_B13 when the B13 clock CLK4D_B13 is changed from a low state to a high state, and the twenty-sixth data output unit 175_26 may output 'A5' as the thirteenth feedback output data DOUT_F_B13 when the B13 clock CLK4D_B13 is changed from a high state to a low state. In addition, the thirty-seventh data output unit 175_37 may output '96' as the twenty-fourth reference output data DOUT_R_B24 when the B24 clock CLK4D_B24 is changed from a low state to a high state, and the forty-eighth data output unit 175_48 may output '87' as the twenty-fourth feedback output data DOUT_F_B24 when the B24 clock CLK4D_B24 is changed from a high state to a low state. Therefore, the fifteenth data output unit 175_15, the twenty-sixth data output unit 175_26, the thirty-seventh data output unit 175_37, and the forty-eighth data output unit 175 48 may sequentially output data to the memory controller.

In an embodiment, '78' may be output as the thirteenth low bit data IOB13_LB when the first bank low select signal SEL_B1_LB again changes to be at a high state, and '3C' may be output as the thirteenth low bit data IOB13_LB when the third bank low select signal SEL_B3_LB again changes to be at a high state. In addition, 'F0' may be output as the thirteenth low bit data IOB13_LB when the first bank low select signal SEL_B1_LB again changes to be at a high state, and 'B4' may be output as the thirteenth low bit data IOB13_LB when the third bank low select signal SEL_B3_LB again changes to be at a high state. The thirteenth low bit data IOB13_LB may be output when a read clock POUT_CLK (RE_N) is changed from a low state to a high state, in synchronization with the read clock POUT_CLK (RE_N).

In an embodiment, '69' may be output as the thirteenth high bit data IOB13_HB when the first bank high select signal SEL_B1_HB again changes to be at a high state, and '2D' may be output as the thirteenth high bit data IOB13_HB when the third bank high select signal SEL_B3_HB again changes to be at a high state. In addition, 'E1' may be output as the thirteenth high bit data IOB13_HB when the first bank high select signal SEL_B1_HB again changes to be at a high state, and 'A5' may be output as the thirteenth high bit data IOB13_HB when the third bank high select signal SEL_B3_HB again changes to be at a high state. The thirteenth high bit data IOB13_HB may be output when the read clock POUT_CLK (RE_N) is changed from a low state to a high state, in synchronization with the read clock POUT_CLK (RE_N).

In an embodiment, '5A' may be output as the twenty-fourth low bit data IOB24_LB when the second bank low select signal SEL_B2_LB again changes to be at a high state, and '1E' may be output as the twenty-fourth low bit data IOB24_LB when the fourth bank low select signal SEL_B4_LB again changes to be at a high state. In addition, 'D2' may be output as the twenty-fourth low bit data IOB24_LB when the second bank low select signal SEL_B2_LB again changes to be at a high state. The twenty-fourth low bit data IOB24_LB may be output when the read clock POUT_CLK (RE_N) is changed from a low state to a high state, in synchronization with the read clock POUT_CLK (RE_N).

In an embodiment, '4B' may be output as the twenty-fourth high bit data IOB24_HB when the second bank high select signal SEL_B2_HB again changes to be at a high state, and '0F' may be output as the twenty-fourth high bit data IOB24_HB when the fourth bank high select signal SEL_B4_HB again changes to be at a high state. In addition, 'C3' may be output as the twenty-fourth high bit data IOB24_HB when the second bank high select signal SEL_B2_HB again changes to be at a high state. The twenty-fourth high bit data IOB24_HB may be output when the read clock POUT_CLK (RE_N) is changed from a low state to a high state, in synchronization with the read clock POUT_CLK (RE_N).

Subsequently, the thirteenth low bit data IOB13_LB, the thirteenth high bit data IOB13_HB, the twenty-fourth low bit data IOB24_LB, and the twenty-fourth high bit data IOB24_HB may be sequentially output based on the B13 clock CLK4D_B13 and the B24 clock CLK4D_B24.

For example, the thirteenth low bit data IOB13_LB 'B4' may be output as the thirteenth reference output data DOUT_R_B13 when the B13 clock CLK4D_B13 is changed from a low state to a high state, and the thirteenth high bit data IOB13_HB 'A5' may be as the thirteenth feedback output data DOUT_F_B13 when the B13 clock CLK4D_B13 is changed from a high state to a low state. Subsequently, the twenty-fourth low bit data IOB24_LB '96' may be output as the twenty-fourth reference output data DOUT_R_B24 when the B24 clock IOB24_LB is changed from a low state to a high state, and the twenty-fourth high bit data IOB24_HB '87' may be output as the twenty-fourth feedback output data DOUT_F_B24 when the B24 clock CLK4D_B24 is changed from a high state to a low state.

The thirteenth low bit data IOB13_LB '78' may be output as the thirteenth reference output data DOUT_R_B13 when the B13 clock CLK4D_B13 is again changed from a low state to a high state, and the thirteenth high bit data IOB13_HB '69' may be output as the thirteenth feedback output data DOUT_F_B13 when the B13 clock CLK4D_B13 is again changed from a high state to a low state. Subsequently, the twenty-fourth low bit data IOB24_LB '5A' may be output as the twenty-fourth reference output data DOUT_R_B24 when the B24 clock CLK4D_B24 is again changed from a low state to a high state, and the twenty-fourth high bit data IOB24_HB '4B' may be output as the twenty-fourth feedback output data DOUT_F_B24 when the B24 clock IOB24_HB is again changed from a high state to a low state.

Through the above-described process, the thirteenth reference output data DOUT_R_B13, the thirteenth feedback output data DOUT_F_B13, the twenty-fourth reference output data DOUT_R_B24, and the twenty-fourth feedback output data DOUT_F_24 may be sequentially output to the memory controller. That is, selected data may be stored in the fifteenth latch unit 173_15, the twenty-sixth latch unit 173_26, the thirty-seventh latch unit 173_37, and the forty-eighth latch unit 173_48 based on a bank select signal, and the data that is stored in the fifteenth latch unit 173_15, the twenty-sixth latch unit 173_26, the thirty-seventh latch unit 173_37, and the forty-eighth latch unit 173_48 may be sequentially output to the memory controller based on the B13 clock CLK4D_B13 and the B24 clock CLK4D_B24.

Figure 7:
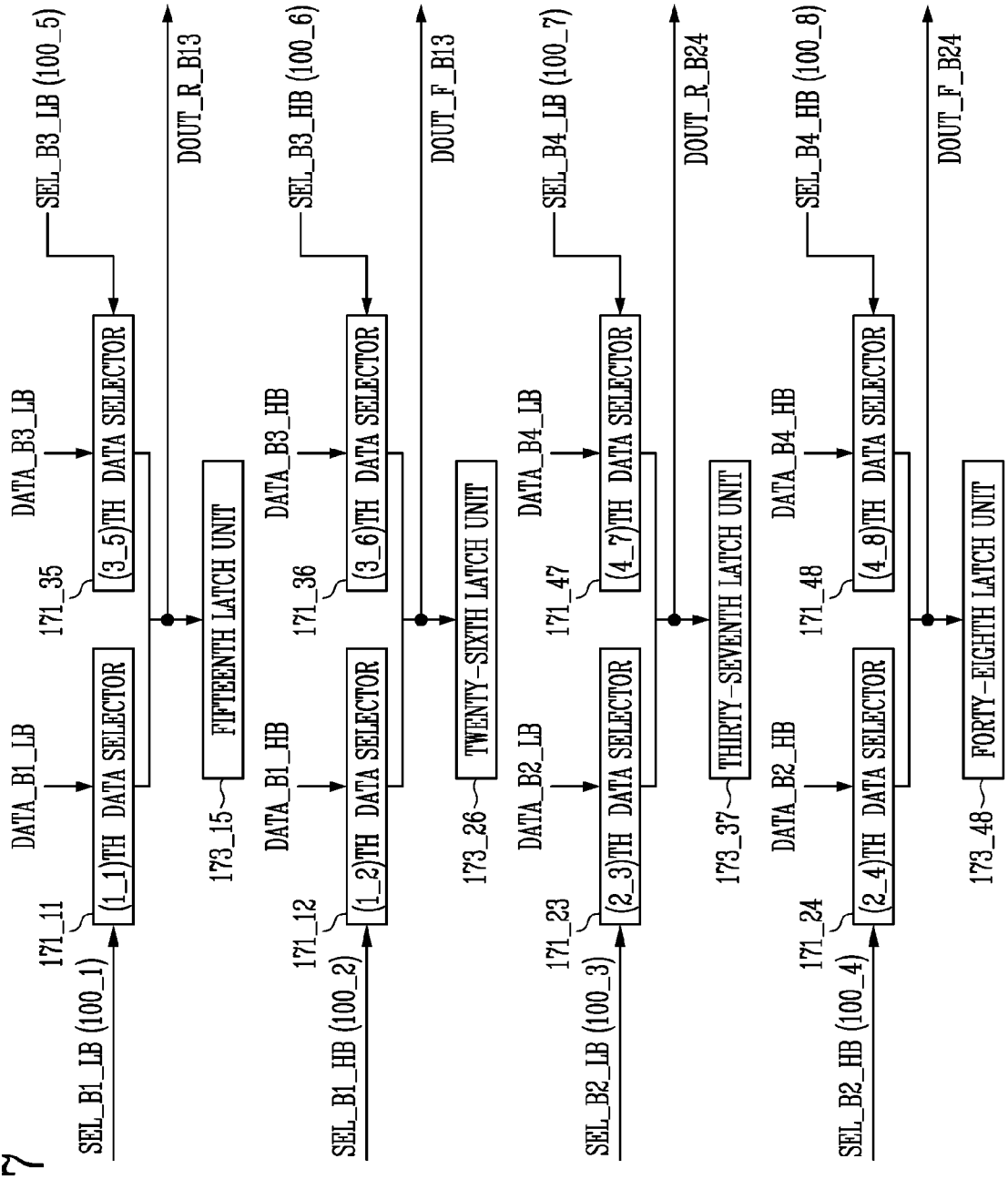
FIG. 7 is a diagram illustrating a process of outputting data through two stages.

FIG. 7 is a diagram illustrating a process of outputting data through two stages.

Referring to FIGS. 5 and 7, FIG. 7 illustrates a method for omitting the second stage through which data that is stored in the latch unit is output to the data output unit in the process of outputting data through the three stages in FIG. 5, and outputting the data that is stored in the latch unit as output data. In FIG. 7, descriptions of portions overlapping with those shown in FIG. 5 will be omitted.

In FIG. 5, since data is to be output through the three stages, the current amount that is consumed in the data that is output process increase, and a data transmission delay may be caused.

Accordingly, in FIG. 7, there is proposed a method for merging two stages among the three stages, i.e., a method for immediately outputting data that is stored in the latch unit as output data.

In an embodiment, the first bank low bit data DATA_B1_LB may be output to the fifteenth latch unit 173_15 when the (1_1)th data selector 171_11 is selected based on the first bank low select signal SEL_B1_LB, and the first bank high bit data DATA_B1_HB may be output to the twenty-sixth latch unit 173_26 when the (1_2)th data selector 171_12 is selected based on the first bank high select signal SEL_B1_HB.

In addition, the second bank low bit data DATA_B2_LB may be output to the thirty-seventh latch unit 173_37 when the (2_3)th data selector 171_23 is selected based on the second bank low select signal SEL_B2_LB, and the second bank high bit data DATA_B2_HB may be output to the forty-eighth latch unit 173_48 when the (2_4)th data selector 171_24 is selected based on the second bank high select signal SEL_B2_HB.

Similarly, the third bank low bit data DATA_B3_LB may be output to the fifteenth latch unit 173_15 when the (3_5)th data selector 171_35 is selected based on the third bank low select signal SEL_B3_LB, and the third bank high bit data DATA_B3_HB may be output to the twenty-sixth latch unit 173_26 when the (3_6)th data selector 171_36 is selected based on the third bank high select signal SEL_B3_HB.

In addition, the fourth bank low bit data DATA_B4_LB may be output to the thirty-seventh latch unit 173_37 when the (4_7)th data selector 171_47 is selected based on the fourth bank low select signal SEL_B4_LB, and the fourth bank high bit data DATA_B4_HB may be output to the forty-eighth latch unit 173_48 when the (4_8)th data selector 171_48 is selected based on the fourth bank high select signal SEL_B4_HB.

However, unlike FIG. 5, the data that is stored in the fifteenth latch unit 173_15, the twenty-sixth latch unit 173_26, the thirty-seventh latch unit 173_37, and the forty-eighth latch unit 173_48 are not transferred to the data output unit, but may be immediately output as output data.

That is, the data that is stored in the fifteenth latch unit 173_15 may be output as the thirteenth reference output data DOUT_R_B13 to the memory controller (200 shown in FIG. 4), the data that is stored in the twenty-sixth latch unit 173_26 may be output as the thirteenth feedback output data DOUT_F_B13 to the memory controller (200 shown in FIG. 4), the data that is stored in the thirty-seventh latch unit 173_37 may be output as the twenty-fourth reference output data DOUT_R_B24 to the memory controller (200 shown in FIG. 4), and the data that is stored in the forty-eighth latch unit 173_48 may be output as the twenty-fourth feedback output data DOUT_F_B24 to the memory controller (200 shown in FIG. 4).

However, since data is not output by the data output unit, the data that is stored in the fifteenth latch unit 173_15, the twenty-sixth latch unit 173_26, the thirty-seventh latch unit 173_37, and the forty-eighth latch unit 173_48 may be sequentially output based on the first bank low select signal SEL_B1_LB, the first bank high select signal SEL_B1_HB, the second bank low select signal SEL_B2_LB, the second bank high select signal SEL_B2_HB, the third bank low select signal SEL_B3_LB, the third bank high select signal SEL_B3_HB, the fourth bank low select signal SEL_B4_LB, and the fourth bank high select signal SEL_B4_HB.

Figure 8:
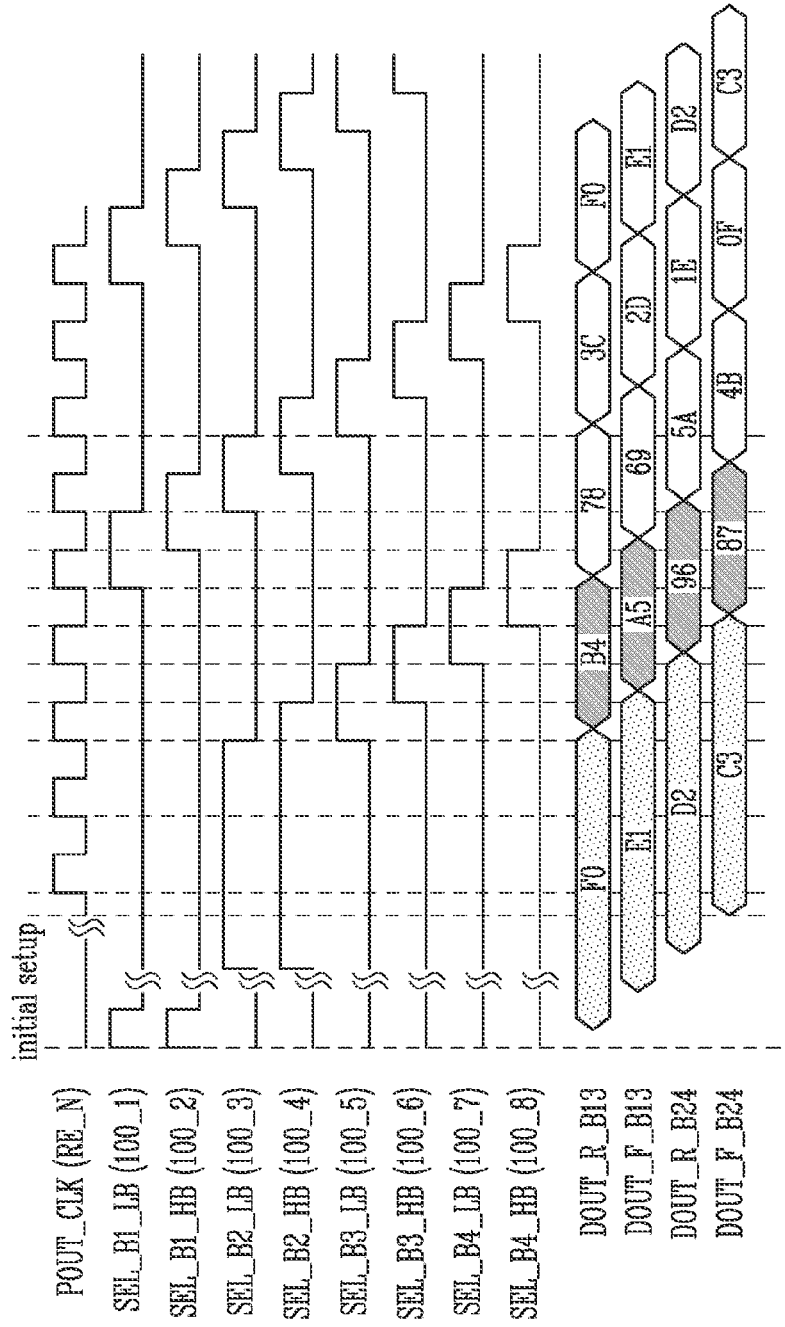
FIG. 8 is a diagram illustrating signals and clocks that control data to be output through two stages.

FIG. 8 is a diagram illustrating signals and clocks, which control data to be output through two stages.

Referring to FIGS. 7 and 8, FIG. 8 illustrates a state of each signal and output data, when data are selected and output from the data selector shown in FIG. 7. In FIG. 8, the first bank low select signal SEL_B1_LB may correspond to the first memory device (100_1 shown in FIG. 4), the first bank high select signal SEL_B1_HB may correspond to the second memory device (100_2 shown in FIG. 4), the second bank low select signal SEL_B2_LB may correspond to the third memory device (100_3 shown in FIG. 4), the second bank high select signal SEL_B2_HB may correspond to the fourth memory device (100_4 shown in FIG. 4), the third bank low select signal SEL_B3_LB may correspond to the fifth memory device (100_5 shown in FIG. 4), the third bank high select signal SEL_B3_HB may correspond to the sixth memory device (100_6 shown in FIG. 4), the fourth bank low select signal SEL_B4_LB may correspond to the seventh memory device (100_7 shown in FIG. 4), and the fourth bank high select signal SEL_B4_HB may correspond to the eighth memory device (100_8 shown in FIG. 4).

In an initial setup, since the first bank low select signal SEL_B1_LB and the first bank high select signal SEL_B1_HB are in a high state, the (1_1)th data selector 171_11 and the (1_2)th data selector 171_12 may be selected.

Therefore, data that is output from the (1_1)th data selector 171_11 may be output as the thirteenth reference output data DOUT_R_B13 ('F0') when the read clock POUT_CLK (RE_N) is changed from a low state to a high state, and data that is output from the (1_2)th data selector 171_12 may be output as the thirteenth feedback output data DOUT_F_B13 ('E1') when the read clock POUT_CLK (RE_N) is changed from a high state to a low state.

Subsequently, when the second bank low select signal SEL_B2_LB and the second bank high select signal SEL_B2_HB change to be at a high state, the (2_3)th data selector 171_23 and the (2_4)th data selector 171_24 may be selected.

Therefore, data that is output from the (2_3)th data selector 171_23 may be output as the twenty-fourth reference output data DOUT_R_B24 ('D2') when the read clock POUT_CLK (RE_N) is changed from a low state to a high state, and data that is output from the (2_4)th data selector 171_24 may be output as the twenty-fourth feedback output data DOUT_F_B24 ('C3') when the read clock POUT_CLK (RE_N) is changed from a high state to a low state.

When the initial setup is ended, the third bank low select signal SEL_B3_LB may change to be at a high state when the read clock POUT_CLK (RE_N) is changed from a low state to a high state, in synchronization with the read clock POUT_CLK (RE_N), and the third bank high select signal SEL_B3_HB may change to be at a high state when the read clock POUT_CLK (RE_N) is changed from a high state to a low state, in synchronization with the read clock POUT_CLK (RE_N). That is, the third bank low select signal SEL_B3_LB and the third bank high select signal SEL_B3_HB may sequentially change to be at a high state, in synchronization with the read clock POUT_CLK (RE_N).

Further, the second bank low select signal SEL_B2_LB changes to be at a low state when the third bank low select signal SEL_B3_LB changes to be at a high state, and the second bank high select signal SEL_B2_HB changes to be at a low state when the third bank high select signal SEL_B3_HB changes to be at a high state, so that the (4_7)th data selector 171_47 and the (4_8)th data selector 171_48 can change to be at a state in which the (4_7)th data selector 171_47 and the (4_8)th data selector 171_48 can be selected.

When the third bank low select signal SEL_B3_LB and the third bank high select signal SEL_B3_HB change to be at a high state, the (3_5)th data selector 171_35 and the (3_6)th data selector 171_36 may be selected.

Therefore, data that is output from the (3_5)th data selector 171_35 may be output as the thirteenth reference output data DOUT_R_B13 ('B4') when the read clock POUT_CLK (RE_N) is changed from a low state to a high state, and data that is output from the (3_6)th data selector 171_36 may be output as the thirteenth feedback output data DOUT_F_B13 ('A5') when the read clock POUT_CLK (RE_N) is changed from a high state to a low state.

Subsequently, the fourth bank low select signal SEL_B4_LB may change to be at a high state when the third bank low select signal SEL_B3_LB is changed from a high state to a low state, and the fourth bank high select signal SEL_B4_HB may change to be at a high state when the third bank high select signal SEL_B3_HB is changed from a high state to a low state. That is, in order to sequentially output data, the fourth bank low select signal SEL_B4_LB may change to be at a high state when the third bank low select signal SEL_B3_LB changes to be at a low state, and the fourth bank high select signal SEL_B4_HB may change to be at a high state when the third bank high select signal SEL_B3_HB changes to be at a low state.

When the fourth bank low select signal SEL_B4_LB and the fourth bank high select signal SEL_B4_HB change to be at a high state, the (4_7)th data selector 171_47 and the (4_8)th data selector 171_48 may be selected.

Therefore, data that is output from the (4_7)th data selector 171_47 may be output as the twenty-fourth reference output data DOUT_R_B24 ('96') when the read clock POUT_CLK (RE_N) is changed from a low state to a high state, and data that is output from the (4_8)th data selector 171_48 may be output as the twenty-fourth feedback output data DOUT_F_B24 ('87') when the read clock POUT_CLK (RE_N) is changed from a high state to a low state.

Subsequently, the first bank low select signal SEL_B1_LB may change to be at a high state when the fourth bank low select signal SEL_B4_LB is changed from a high state to a low state, and the first bank high select signal SEL_B1_HB may change to be at a high state when the fourth bank high select signal SEL_B4_HB is changed from a high state to a low state. That is, in order to sequentially output data, the first bank low select signal SEL_B1_LB may change to be at a high state when the fourth bank low select signal SEL_B4_LB changes to be at a low state, and the first bank high select signal SEL_B1_HB may change to be at a high state when the fourth bank high select signal SEL_B4_HB changes to be at a low state.

Since the first bank low select signal SEL_B1_LB and the first bank high select signal SEL_B1_HB again change to be at a high state, the (1_1)th data selector 171_11 and the (1_2)th data selector 171_12 may be selected.

Therefore, data that is output from the (1_1)th data selector 171_11 may be output as the thirteenth reference output data DOUT_R_B13 ('78') when the read clock POUT_CLK (RE_N) is changed from a low state to a high state, and data that is output from the (1-2)th data selector 171_12 may be output as the thirteenth feedback output data DOUT_F_B13 ('69') when the read clock POUT_CLK (RE_N) is changed from a high state to a low state.

Subsequently, the second bank low select signal SEL_B2_LB may change to be at a high state when the first bank low select signal SEL_B1_LB is changed from a high state to a low state, and the second bank high select signal SEL_B2_HB may change to be at a high state when the first bank high select signal SEL_B1_HB is changed from a high state to a low state.

Therefore, the (2_3)th data selector 171_23 and the (2_4)th data selector 171_24 may be again selected when the second bank low select signal SEL_B2_LB and the second bank high select signal SEL_B2_HB change to be at a high state. Data that is output from the (2_3)th data selector 171_23 may be output as the twenty-fourth reference output data DOUT_R_B24 ('5A') when the read clock POUT_CLK (RE_N) is changed from a low state to a high state, and data that is output from the (2_4)th data selector 171_24 may be output as the twenty-fourth feedback output data DOUT_F_B24 ('4B') when the read clock POUT_CLK (RE_N) is changed from a high state to a low state.

As described above, in a subsequent data that is output process, the thirteenth reference output data DOUT_R_B13, the thirteenth feedback output data DOUT_F_B13, the twenty-fourth reference output data DOUT_R_B24, and the twenty-fourth feedback output data DOUT_F_B24 may be sequentially output. That is, after '4B' is output as the twenty-fourth feedback output data DOUT_F_B24, '3C,' '2D,' '1E,' '0F,' 'F0,' 'E1,' 'D2,' and 'C3' may be sequentially output. The thirteenth reference output data DOUT_R_B13, the thirteenth feedback output data DOUT_F_B13, the twenty-fourth reference output data DOUT_R_B24, and the twenty-fourth feedback output data DOUT_F_B24, which are sequentially output, may be sequentially output based on the first bank low select signal SEL_B1_LB, the first bank high select signal SEL_B1_HB, the second bank low select signal SEL_B2_LB, the second bank high select signal SEL_B2_HB, the third bank low select signal SEL_B3_LB, the third bank high select signal SEL_B3_HB, the fourth bank low select signal SEL_B4_LB, and the fourth bank high select signal SEL_B4_HB.

That is, since the bank low select signal is generated based on the read clock POUT_CLK (RE_N), another bank low select signal may change to be at a high state when any one bank low select signal changes to be at a low state.

In FIG. 8, the second bank low select signal SEL_B2_LB may change to be at a high state after the first bank low select signal SEL_B1_LB changes to be at a low state, the third bank low select signal SEL_B3_LB may change to be at a high state after the second bank low select signal SEL_B2_LB changes to be at a low state, and the fourth bank low select signal SEL_B4_LB may change to be at a high state after the third bank low select signal SEL_B3_LB changes to be at a low state.

Similarly, since the bank high select signal is generated by using, as a clock input, a clock obtained by inverting the read clock POUT_CLK (RE_N), another bank high select signal may change to be at a high state when any one bank high select signal changes to be at a low state.

In FIG. 8, the second bank high select signal SEL_B2_HB may change to be at a high state after the first bank high select signal SEL_B1_HB changes to be at a low state, the third bank high select signal SEL_B3_HB may change to be at a high state after the second bank high select signal SEL_B2_HB changes to be at a low state, and the fourth bank high select signal SEL_B4_HB may changes to be at a high state after the third bank high select signal SEL_B3_HB changes to be at a low state.

In addition, since the bank high select signal is generated based on the inverted read clock, the bank high signal changes to be at a high state after a ½ clock elapses after the bank low signal changes to be at a high state, and therefore, data may be sequentially output based on the bank low select signal and the bank high select signal. That is, data may be output when the bank low select signal and the bank high select signal are changed from a low state to a high state or when the bank low select signal and the bank high select signal are changed from a high state to a low state. Therefore, the data may be sequentially output.

That is, the first bank high select signal SEL_B1_HB may change to be at a high state after the read clock POUT_CLK (RE_N) elapses by a ½ clock after the first bank low select signal SEL_B1_LB changes to be at a high state, and the second bank low select signal SEL_B2_LB may change to be at a high state after the read clock POUT_CLK (RE_N) elapses by a ½ clock after the first bank high select signal SEL_B1_HB changes to be at a high state.

In the above-described manner, the bank low select signal and the bank high select signal may change to be at a high state in a ½ clock period.

Consequently, the first to fourth bank low select signals SEL_B1_LB to SEL_B4_LB are generated based on the read clock POUT_CLK (RE_N), and the first to fourth bank high select signals SEL_B1_HB to SEL_B4_HB are generated based on the clock obtained by inverting the read clock POUT_CLK (RE_N). Thus, data can be sequentially output to the memory controller (200 shown in FIG. 4) based on the first to fourth bank low select signals SEL_B1_LB to SEL_B4_LB and the first to fourth bank high select signals SEL_B1_HB to SEL_B4_HB.

Figure 9:
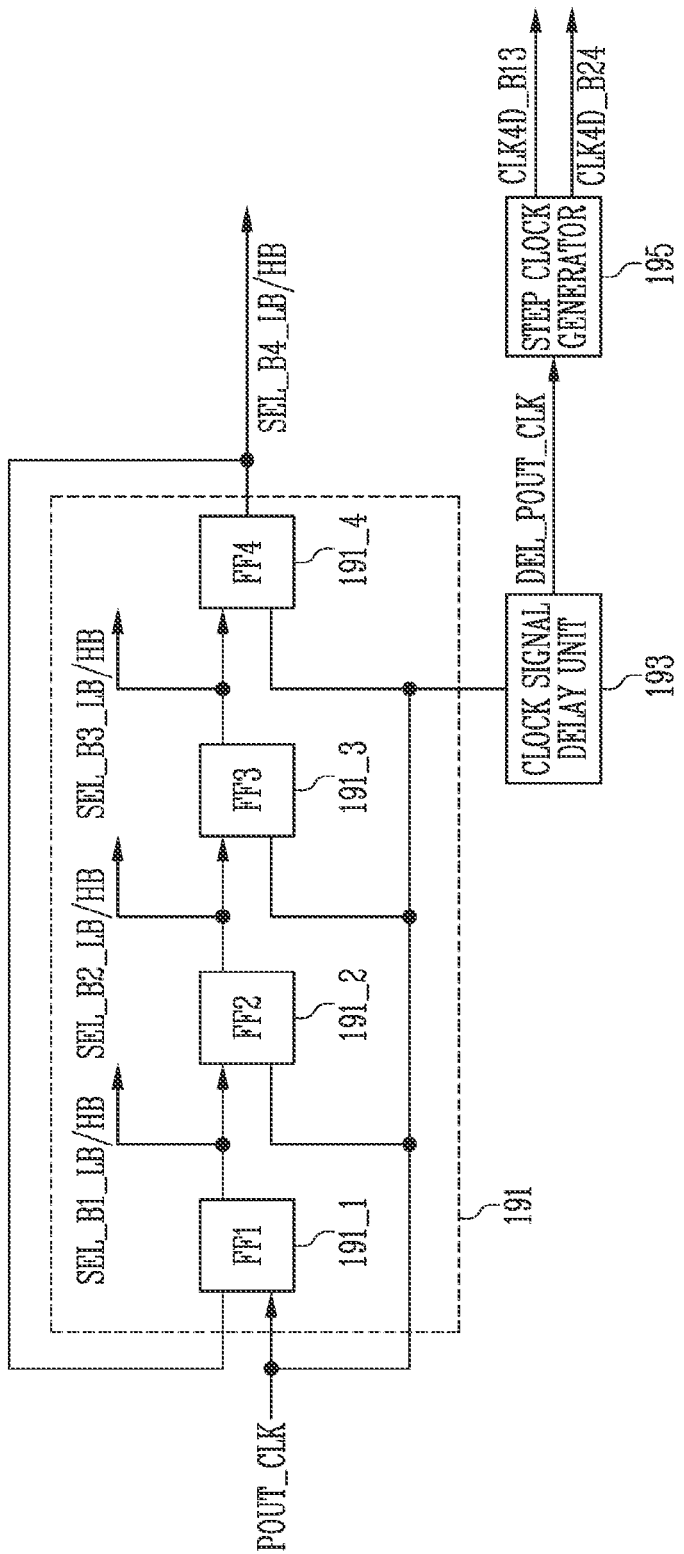
FIG. 9 is a diagram illustrating a process of generating a control signal that outputs data through three stages.

That is, data can be sequentially output based on only the first to fourth bank low select signals SEL_B1_LB to SEL_B4_LB and the first to fourth bank high select signals SEL_B1_HB to SEL_B4_HB, without generating the B13 clock CLK4D_B13 and the B24 clock CLK4D_B24, which are shown in FIG. 9.

FIG. 9 is a diagram illustrating a process of generating a control signal that outputs data through three stages.

Referring to FIGS. 1 and 9, the transmission control signal generator (190 shown in FIG. 1) may include a select signal generator 191, a clock signal delay unit 193, and a step clock generator 195, which are shown in FIG. 9. The components included in the transmission control signal generator (190 shown in FIG. 1) may control signals for sequentially outputting data that is output from each of the memory devices included in the first to fourth banks (70_1 to 70_4 shown in FIG. 5) to be generated. In FIG. 9, the read clock POUT_CLK (RE_N) may be received from the outside.

In an embodiment, the select signal generator 191 may be configured with first to fourth flip-flops 191_1 to 191_4. Each of the first to fourth flip-flops 191_1 to 191_4 may be configured as a D flip-flop. The D flip-flop may output data that is input based on a clock input. The clock signal delay unit 193 may delay and output a clock input, and the step clock generator 195 may generate a clock signal for sequentially outputting data that is stored in the first to fourth banks (70_1 to 70_4 shown in FIG. 5), based on the delayed clock input. Also, the step clock generator 195 may be configured with a D flip-flop, an inverter (NOT gate), and an AND gate.

In an embodiment, the first to fourth flip-flops 191_1 to 191_4 may receive the read clock POUT_CLK (RE_N) as a clock input. Therefore, the first to fourth flip-flops 191_1 to 191_4 may respectively output the first bank low select signal and the first bank high select signal SEL_B1_LB/HB, the second bank low select signal and the second bank high select signal SEL_B2_LB/HB, the third bank low select signal and the third bank high select signal SEL_B3_LB/HB, and the fourth bank low select signal and the fourth bank high select signal SEL_B4_LB/HB based on the read clock POUT_CLK (RE_N). The fourth bank low select signal and the fourth bank high select signal SEL_B4_LB/HB may be again input the first flip-flop 191_1.

In FIG. 9, it is assumed that each of the first bank low select signal SEL_B1_LB and the first bank high select signal SEL_B1_HB, the second bank low select signal SEL_B2_LB and the second bank high select signal SEL_B2_HB, the third bank low select signal SEL_B3_LB and the third bank high select signal SEL_B3_HB, and the fourth bank low select signal SEL_B4_LB and the fourth bank high select signal SEL_B4_HB are in the same state. That is, since select signals are divided for each bank, it is assumed that both the signals SEL_B1_LB and SEL_B1_HB corresponding to the first bank are in the same state, both the signals SEL_B2_LB and SEL_B2_HB corresponding to the second bank are in the same state, both the signals SEL_B3_LB and SEL_B3_HB corresponding to the third bank are in the same state, and both the signals SEL_B4_LB and SEL_B4_HB corresponding to the fourth bank are in the same state.

For example, the first flip-flop 191_1 may output the first bank low select signal and the first bank high select signal SEL_B1_LB/HB by using the read clock POUT_CLK (RE_N) as a clock input and by using the fourth bank low select signal and the fourth bank high select signal SEL_B4_LB/HB as a feedback input.

The second flip-flop 191_2 may output the second bank low select signal and the second bank high select signal SEL_B2_LB/HB by using the read clock POUT_CLK (RE_N) as a clock input and by using the first bank low select signal and the first bank high select signal SEL_B1_LB/HB as an input.

The third flip-flop 191_3 may output the third bank low select signal and the third bank high select signal SEL_B3_LB/HB by using the read clock POUT_CLK (RE_N) as a clock input and by using the second bank low select signal and the second bank high select signal SEL_B2_LB/HB as an input.

The fourth flip-flop 191_4 may output the fourth bank low select signal and the fourth bank high select signal SEL_B4_LB/HB by using the read clock POUT_CLK (RE_N) as a clock input and by using the third bank low select signal and the third bank high select signal SEL_B3_LB/HB as an input.

In an embodiment, the clock signal delay unit 193 may generate a delay read clock DEL_POUT_CLK obtained by delaying the read clock POUT_CLK (RE_N) so as to generate a signal for sequentially outputting data that is stored in the first to fourth bank (70_1 to 70_4 shown in FIG. 5) to the memory controller (200 shown in FIG. 4). The generated delay read clock DEL_POUT_CLK may be output to the step clock generator 195.

In an embodiment, the step clock generator 195 may generate the B13 clock CLK4D_B13 and the B24 clock CLK4D_B24 for sequentially outputting data based on the delay read clock DEL_POUT_CLK. Data may be output whenever the B13 clock CLK4D_B13 and the B24 clock CLK4D_B24 are changed from a low state to a high state or whenever the B13 clock CLK4D_B13 and the B24 clock CLK4D_B24 are changed from a high state to a low state, so that the data that is stored in the first to fourth bank (70_1 to 70_4 shown in FIG. 5) may be sequentially output to the memory controller (200 shown in FIG. 4).

However, in a structure in which stages are merged as shown in FIG. 7, the B13 clock CLK4D_B13 and the B24 clock CLK4D_B24 might not be generated, and hence, it may be necessary to generate the first bank low select signal SEL_B1_LB, the first bank high select signal SEL_B1_HB, the second bank low select signal SEL_B2_LB, the second bank high select signal SEL_B2_HB, the third bank low select signal SEL_B3_LB, the third bank high select signal SEL_B3_HB, the fourth bank low select signal SEL_B4_LB, and the fourth bank high select signal SEL_B4_HB, which are used to sequentially output data. The first bank low select signal SEL_B1_LB, the first bank high select signal SEL_B1_HB, the second bank low select signal SEL_B2_LB, the second bank high select signal SEL_B2_HB, the third bank low select signal SEL_B3_LB, the third bank high select signal SEL_B3_HB, the fourth bank low select signal SEL_B4_LB, and the fourth bank high select signal SEL_B4_HB may sequentially change to be at a high state.

Figure 10:
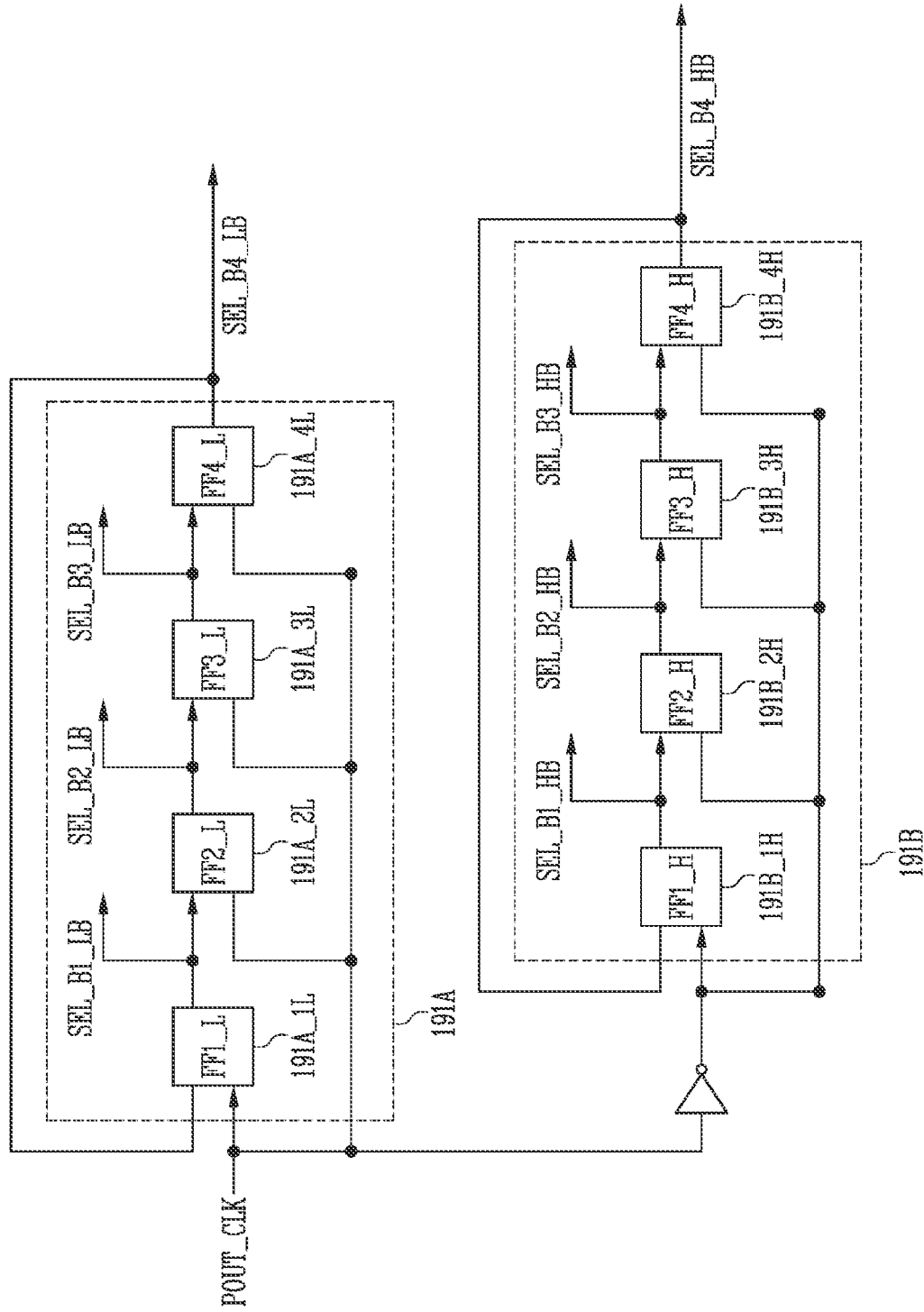
FIG. 10 is a diagram illustrating a process of generating a control signal that outputs data through two stages.

FIG. 10 is a diagram illustrating a process of generating a control signal that outputs data through two stages.

Referring to FIGS. 1, 9, and 10, the transmission control signal generator (190 shown in FIG. 1) may include an Ath select signal generator 191A and a Bth select signal generator 191B, which are shown in FIG. 10. The Ath select signal generator 191A may include 1Lth to 4Lth flip-flops 191A_1L to 191A_4L, and the Bth select signal generator 191B may include 1Hth to 4Hth flip-flops 191B_1H to 191B_4H. Unlike FIG. 9, FIG. 10 might not include the clock signal delay unit (193 shown in FIG. 9) and the step clock generator (195 shown in FIG. 9).

In FIG. 10, each of the 1Lth to 4Lth flip-flops 191A_1L to 191A_4L and the 1Hth to 4Hth flip-flops 191B_1H to 191B_4H may be configured as a D flip-flop. The D flip-flop may output data that is input based on a clock input. In FIG. 10, the read clock POUT_CLK (RE_N) may be received from the outside.

In an embodiment, the 1Lth to 4Lth flip-flops 191A_1L to 191A_4L may receive the read clock POUT_CLK (RE_N) as a clock input, and the 1Hth to 4Hth flip-flops 191B_1H to 191B_4H may receive, as a clock input, a clock obtained by inverting the read clock POUT_CLK (RE_N). The 1Lth to 4Lth flip-flops 191A_1L to 191A_4L may output the bank low select signal, and the 1Hth to 4Hth flip-flops 191B_1H to 191B_4H may output the bank high select signal.

In addition, the fourth bank low select signal SEL_B4_LB that is output from the 4Lth flip-flop 191A_4L may be input as a feedback input of the 1Lth flip-flop 191A_1L (feedback), and the fourth bank high select signal SEL_B4_HB that is output from the 4Hth flip-flop 191B_4H may be input as a feedback input of the 1Hth flip-flop 191B_1H (feedback).

Specifically, the 1Lth flip-flop 191A_1L may output the first bank low select signal SEL_B1_LB by using the read clock POUT_CLK (RE_N) as a clock input and by using the fourth bank low select signal SEL_B4_LB as a feedback input. The 2Lth flip-flop 191A_2L may output the second bank low select signal SEL_B2_LB by using the read clock POUT_CLK (RE_N) as a clock input and by using the first bank low select signal SEL_B1_LB as an input. The 3Lth flip-flop 191A_3L may output the third bank low select signal SEL_B3_LB by using the read clock POUT_CLK (RE_N) as a clock input and using the second bank low select signal SEL_B2_LB as an input. The 4Lth flip-flop 191A_4L may output the fourth bank low select signal SEL_B4_LB by using the read clock POUT_CLK (RE_N) as a clock input and using the third bank low select signal SEL_B3_LB as an input.

In addition, the 1Hth flip-flop 191B_1H may output the first bank high select signal SEL_B1_HB by using, a clock input, the clock obtained by inverting the read clock POUT_CLK (RE_N) and by using the fourth bank high select signal SEL_B4_HB as a feedback input. The 2Hth flip-flop 191B_2H may output the second bank high select signal SEL_B2_HB by using a clock input, a clock obtained by inverting the read clock POUT_CLK (RE_N) and by using the first bank high select signal SEL_B1_HB as an input. The 3Hth flip-flop 191B_3H may output the third bank high select signal SEL_B3_HB by using a clock input, a clock obtained by inverting the read clock POUT_CLK (RE_N) and by using the second bank high select signal SEL_B2_HB as an input. The 4Hth flip-flop 191B_4H may output the fourth bank high select signal SEL_B4_HB by using a clock input, a clock obtained by inverting the read clock POUT_CLK (RE_N), and using the third bank high select signal SEL_B3_HB as an input.

Consequently, the first to fourth bank low select signals SEL_1B_LB to SEL_4B_LB may be generated based on the read clock POUT_CLK (RE_N), and the first to fourth bank high select signals SEL_b1_HB to SEL_B4_HB may be generated based on the clock that is obtained by inverting the read clock POUT_CLK (RE_N). Thus, data may be sequentially output to the memory controller (200 shown in FIG. 4) based on the first to fourth bank low select signals SEL_1B_LB to SEL_4B_LB and the first to fourth bank high select signals SEL_b1_HB to SEL_B4_HB.

That is, data may be sequentially output based on only the first to fourth bank low select signals SEL_B1_LB to SEL_B4_LB and the first to fourth bank high select signals SEL_B1_HB to SEL_B4_HB, without generating the B13 clock CLK4D_B13 and the B24 clock CLK4D_B24, which are shown in FIG. 9.

Figure 11:
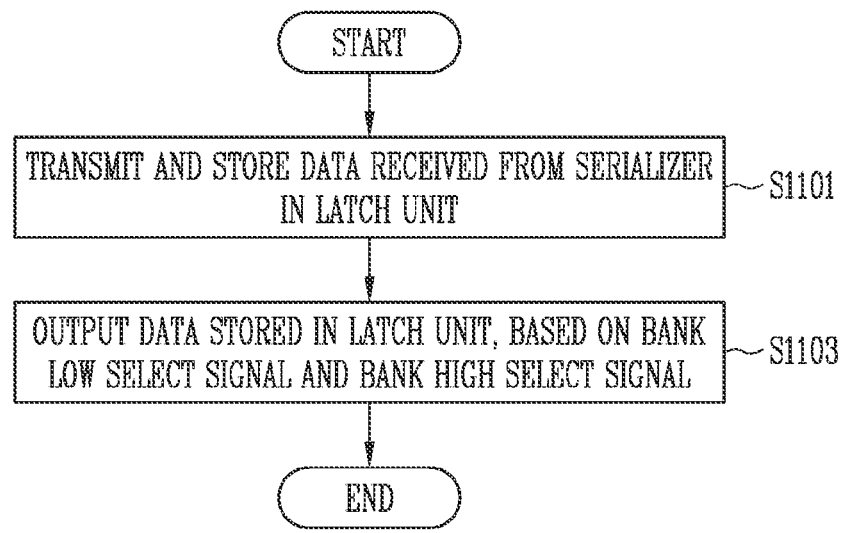
FIG. 11 is a diagram illustrating an operation of the memory device in accordance with an embodiment of the present disclosure.

FIG. 11 is a diagram illustrating an operation of the memory device in accordance with an embodiment of the present disclosure.

Referring to FIG. 11, in step S1101, in a structure with a plurality of banks, data that is stored in each memory device may be transferred to a serializer, and the data that is transferred to the serializer may be transmitted and stored in a latch unit, based on a bank select signal. The serializer may be a device which controls data to be sequentially output, and the bank select signal may be a bank high select signal or a bank low select signal.

In step S1103, the data that is stored in the latch unit, based on the bank high select signal or the bank low select signal, may be output to the memory controller. The bank low select signal may be generated based on a read clock POUT_CLK (RE_N), and the bank high select signal may be generated based on a clock that is obtained by inverting the read clock POUT_CLK (RE_N). Therefore, the data may be sequentially output to the memory controller.

Consequently, since the data is output through two steps, i.e., the steps S1101 and S1103, the current amount that is consumed in the memory device 100 may be decreased, and data output delay may be prevented.

Figure 12:
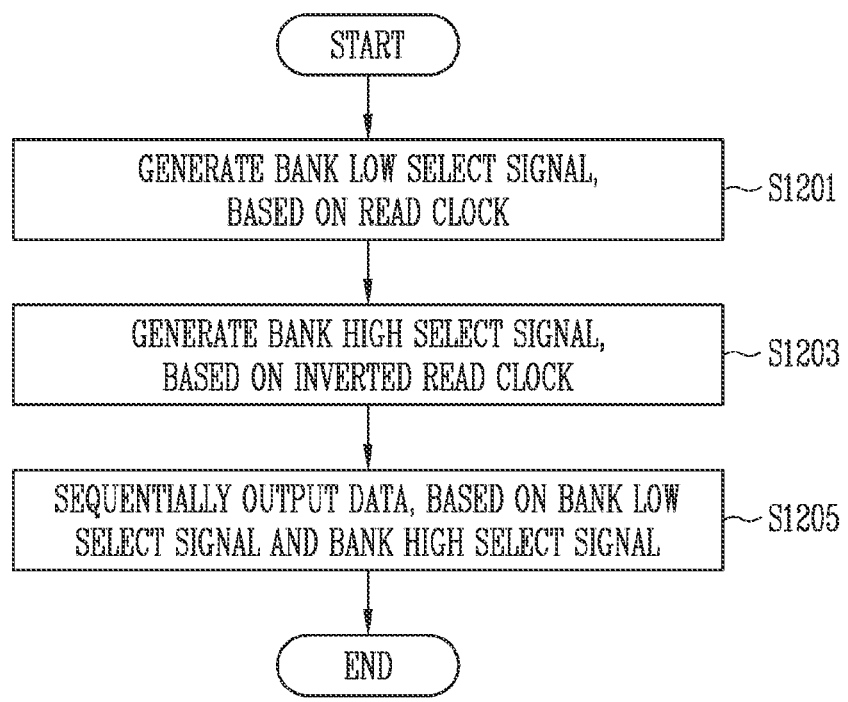
FIG. 12 is a diagram illustrating an operation of the memory device in accordance with an embodiment of the present disclosure.

FIG. 12 is a diagram illustrating an operation of the memory device in accordance with an embodiment of the present disclosure.

Referring to FIG. 12, in step S1201, the memory device may generate a bank low select signal based on a read clock POUT_CLK (RE_N). Since the bank low select signal is generated based on the read clock POUT_CLK (RE_N), another bank low select signal may change to be at a high state when any one bank low select signal changes to be at a low state.

In step S1203, the memory device may generate a bank high select signal based on a read clock obtained by inverting the read clock POUT_CLK (RE_N). Since the bank high select signal is generated based on the inverted read clock, another bank high select signal may change to be at a high state when any one bank high select signal changes to be at a low state.

Further, since the bank high select signal is generated based on the inverted read clock, the bank high select signal may change to be at a high state after a ½ clock elapses after the bank low select signal may change to be at a high state. Therefore, in step S1205, data may be sequentially output based on the bank low select signal and the bank high select signal. That is, data is output when the bank low select signal and the bank high select signal are changed from a low state to a high state or when the bank low select signal and the bank high select signal are changed from a high state to a low state. Therefore, the data may be sequentially output.

Figure 13:
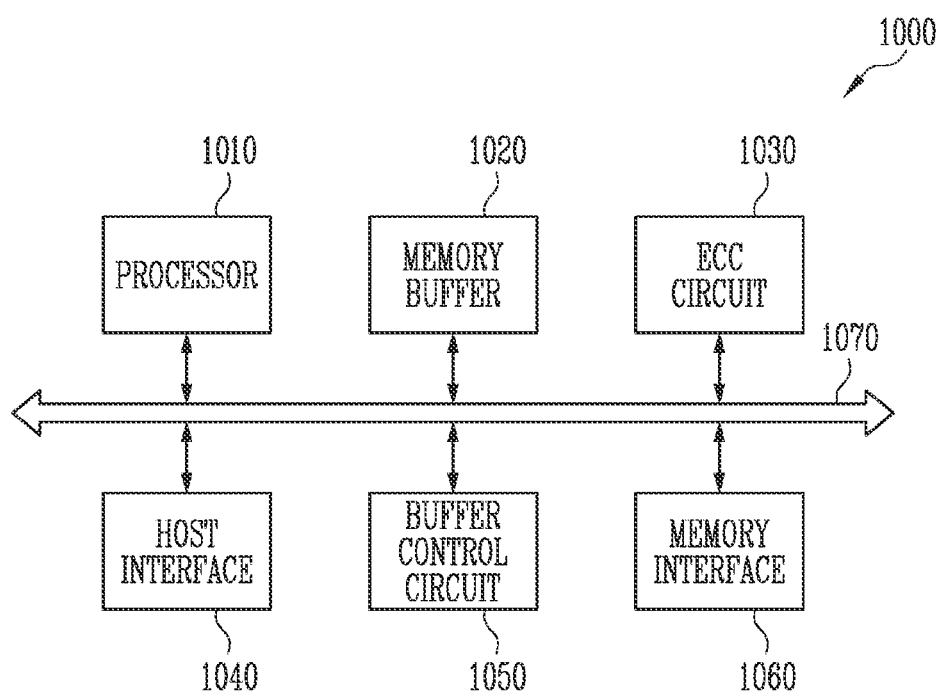
FIG. 13 is a diagram illustrating another embodiment of the memory controller shown in FIG. 1.

FIG. 13 is a diagram illustrating another embodiment of the memory controller shown in FIG. 1.

Referring to FIG. 13, a memory controller 1000 is connected to a host and a memory device. The memory controller 1000 is configured to access the memory device based on a request received from the host. For example, the memory controller 1000 is configured to control read, program, erase, and background operations of the memory device. The memory controller 1000 is configured to provide an interface between the memory device and the host. The memory controller 1000 is configured to drive firmware that controls the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000 and may perform a logical operation. The processor 1010 may communicate with the external host through the host interface 1040 and may communicate with the memory device through the memory interface 1060. Also, the processor 1010 may communicate with the memory buffer 1020 through the buffer control circuit 1050. The processor 1010 may control an operation of the storage device by using the memory buffer 1020 as a working memory, a cache memory, or a buffer memory.

The processor 1010 may perform a function of a flash translation layer (FTL). The processor 1010 may translate a logical block address LBA that is provided by the host through the FTL into a physical block address PBA. The FTL may receive a logic block address LPA, by using a mapping table, to be translated into a physical block address PBA. Several address mapping methods of the FTL exist based on mapping units. A representative address mapping method includes a page mapping method, a block mapping method, and a hybrid mapping method.

The processor 1010 may be configured to randomize data that is received from the host. For example, the processor 1010 may randomize data that is received from the host, by using a randomizing seed. The randomized data is provided as data to be stored to the memory device to be programmed in the memory cell array.

The processor 1010 may perform randomizing and de-randomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may store data that is processed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data that is received from the memory device through the memory interface 1060. Exemplarily, the ECC circuit 1030 may be included as a component of the memory interface 1060 in the memory interface 1060.

The host interface 1040 may communicate with the external host based on the processor 1010. The host interface 1040 may communicate with the host, by using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 based on the processor 1010.

The memory interface 1060 is configured to communicate with the memory device based on the processor 1010. The memory interface 1060 may communicate a command, an address, and data with the memory device through a channel.

Exemplarily, the memory controller 1000 might not include the memory buffer 1020 and the buffer control circuit 1050.

Exemplarily, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

Exemplarily, the bus 1070 of the memory controller 1000 may be divided into a control bus and a data bus. The data bus may be configured to transmit data in the memory controller 1000, and the control bus may be configured to transmit control information, such as a command and an address in the memory controller 1000. The data bus and the control bus are separated from each other, and might not interfere or influence with each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

Figure 14:
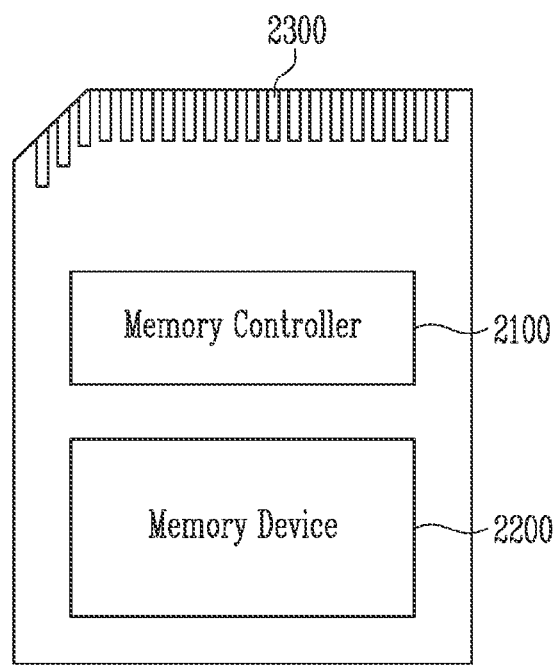
FIG. 14 is a block diagram exemplarily illustrating a memory card system to which the storage device is applied in accordance with an embodiment of the present disclosure.

FIG. 14 is a block diagram exemplarily illustrating a memory card system to which the storage device is applied in accordance with an embodiment of the present disclosure.

Referring to FIG. 14, the memory card system 2000 may include a memory controller 2100, a memory device, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware that controls the memory device 2200. The memory device 2200 may be implemented identically to the memory device 100 (100 shown in FIG. 1).

Exemplarily, the memory controller 2100 may include components, such as a Random Access Memory (RAM), a processing unit, a host interface, a memory interface, and the error corrector 233.

The memory controller 2100 may communicate with an external device through the connector 2300. The memory controller 2100 may communicate with the external device (e.g., the host) based on a specific communication protocol. Exemplarily, the memory controller 2100 may communicate with the external device through at least one of various communication protocols, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

Exemplarily, the memory device 2200 may be implemented with various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card, such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 15:
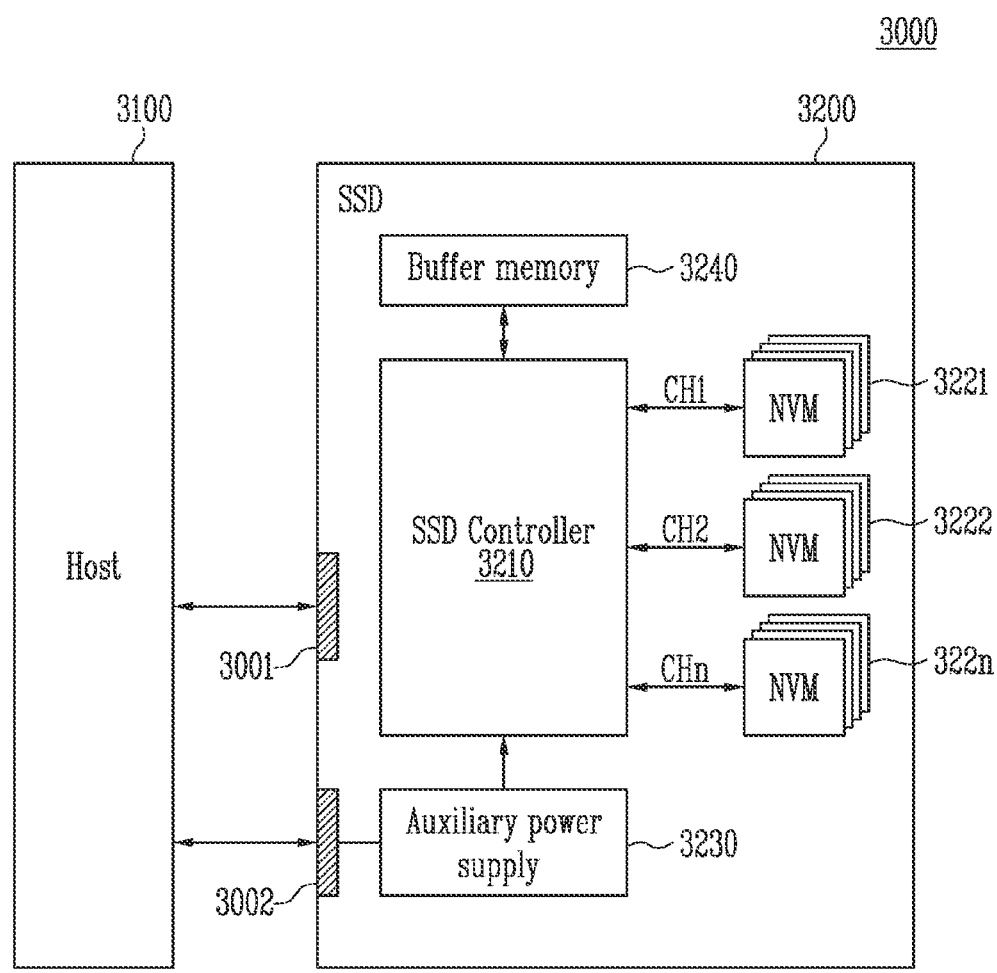
FIG. 15 is a block diagram exemplarily illustrating a Solid State Drive (SSD) system to which the storage device is applied in accordance with an embodiment of the present disclosure.

FIG. 15 is a block diagram exemplarily illustrating a Solid State Drive (SSD) system to which the storage device is applied in accordance with an embodiment of the present disclosure.

Referring to FIG. 15, the SSD system 3000 may include a host 3100 and an SSD 3200. The SSD 3200 exchanges a signal SIG with the host 3100 through a signal connector 3001, and receives power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may serve as the memory controller (200 shown in FIG. 1).

The SSD controller 3210 may control the plurality of flash memories 3221 to 322n based on a signal SIG received from the host 3100. Exemplarily, the signal SIG may be a signal based on an interface between the host 3100 and the SSD 3200. For example, the signal SIG may be a signal defined by at least one of interfaces, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. Exemplarily, the auxiliary power supply 3230 may be located in the SSD 3200 or may be located outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data that is received from the host 3100 or data that is received from the plurality of flash memories 3221 to 322n, or temporarily store meta data (e.g., a mapping table) of the flash memories 3221 to 322n. The buffer memory 3240 may include volatile memories, such as a DRAM, an SDRAM, a DDR SDRAM, an LPDDR SDRAM, and a GRAM or nonvolatile memories, such as a FRAM, a ReRAM, an STT-MRAM, and a PRAM.

Figure 16:
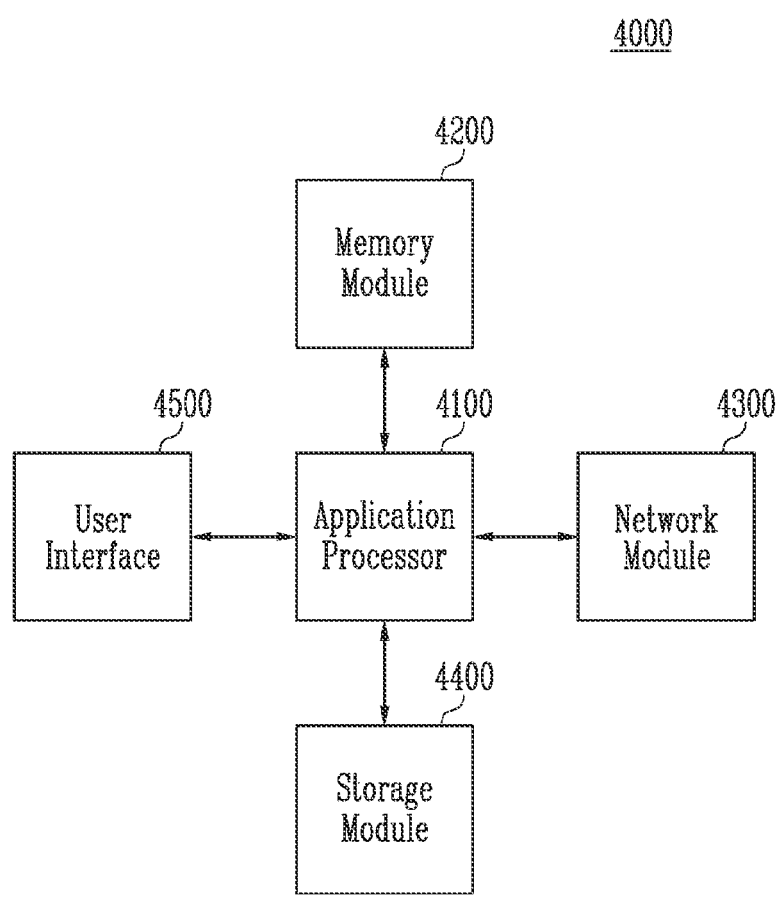
FIG. 16 is a block diagram exemplarily illustrating a user system to which the storage device is applied in accordance with an embodiment of the present disclosure.

FIG. 16 is a block diagram exemplarily illustrating a user system to which the storage device is applied in accordance with an embodiment of the present disclosure.

Referring to FIG. 16, the user system 4000 may include an application processor 4100, a memory module 4200, a network module 4300, a storage module 4400, and a user interface 4500.

The application processor 4100 may drive components included in the user system 4000, an operating system (OS), a user program, or the like. Exemplarily, the application processor 4100 may include controllers that controls components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories, such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories, such as a PRAM, a ReRAM, an MRAM, and a FRAM. Exemplarily, the application processor 4100 and the memory module 4200 may be provided as one semiconductor package by being packaged based on a Package on Package (PoP).

The network module 4300 may communicate with external devices. Exemplarily, the network module 4300 may support wireless communications, such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. Exemplarily, the network module 4300 may be included in the application processor 4100.

The storage module 4400 may store data. For example, the storage module 4400 may store data that is received from the application processor 4100. Alternatively, the storage module 4400 may transmit data that is stored therein to the application processor 4100. Exemplarily, the storage module 4400 may be implemented with a nonvolatile semiconductor memory device, such as a Phase-change RAM (PRAM), a Magnetic RAM (MRAM), a Resistive RAM (RRAM), a NAND flash, a NOR flash, or a NAND flash with a three-dimensional structure. Exemplarily, the storage module 4400 may be provided as a removable drive, such as a memory card of the user system 4000 or an external drive.

Exemplarily, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

The user interface 4500 may include interfaces for inputting data or commands to the application processor 4100 or outputting data to an external device. Exemplarily, the user interface 4500 may include user input interfaces, such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces, such as a Liquid Crystal Display (LCD), an Organic Light Emitting Diode (OLED) display device, an Active Matrix OLED (AMOLED) display device, an LED, a speaker, and a monitor.

In accordance with the present disclosure, the number of transmission stages (steps) is decreased in data transmission.

Thus, a data transmission delay can be prevented, and the current amount that is consumed in the data transmission can be decreased.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A storage device comprising a memory controller and a plurality of banks, each of the plurality of banks including a plurality of memory devices,
   wherein each of the plurality of memory devices includes:
   a data selector configured to select and output data of a memory device, corresponding to the data selector, based on a bank select signal;
   a latch unit configured to store the data that is output from the data selector; and
   a transmission control signal generator configured to generate the bank select signal that controls the data selector to store the data in the latch unit and then to output the data to the memory controller, and
   wherein the transmission control signal generator is configured to:
   generate bank low select signals in the bank select signal based on a reference clock; and
   generate bank high select signals in the bank select signal based on a clock that is obtained by inverting the reference clock.

2. The storage device of claim 1,
   wherein the data selector is configured to output data that is stored in the memory device, corresponding to the data selector, when the bank select signal is in a high state.

3. The storage device of claim 1,
   wherein, when any one of the bank low select signals is in a high state, the transmission control signal generator is configured to output the other bank low select signals to be in a low state.

4. The storage device of claim 1,
   wherein, when any one of the bank low select signals is changed from a high state to a low state, the transmission control signal generator is configured to change any one of the other bank low select signals from the low state to the high state.

5. The storage device of claim 1,
   wherein, when any one of the bank high select signals is in a high state, the transmission control signal generator is configured to output the other bank high select signals to be in a low state.

6. The storage device of claim 1,
   wherein, when any one of the bank high select signals is changed from a high state to a low state, the transmission control signal generator is configured to change any one of the other bank high select signals from the low state to the high state.

7. The storage device of claim 1,
   wherein, when a half period of the reference clock elapses after any one of the bank low select signals changes to be at a high state, the transmission control signal generator is configured to change any one of the bank high select signals to the high state.

8. The storage device of claim 7,
   wherein, when any one of the bank low select signals changes to be at the high state, the data selector is configured to select data that is output from a memory device that corresponds to the corresponding bank low select signal, the memory device is configured to store the data in the latch unit, and then configured to output the data to the memory controller.

9. The storage device of claim 8,
   wherein, when any one of the bank low select signals changes to be at the high state, and any one of the bank high select signals changes to be at the high state after a half period of the reference clock elapses, the data selector is configured to select data that is output from a memory device that corresponds to the corresponding bank high select signal, the memory device is configured to store the data in the latch unit, and then configured to output the data to the memory controller.

10. A method for operating a storage device with a memory controller and a plurality of banks, each of the plurality of banks including a plurality of memory devices, the method comprising:
    generating a bank select signal that controls a data selector to select and output data of a memory device that is included in any one of the plurality of banks; and
    storing the data in a latch unit based on the bank select signal and then outputting the data to the memory controller,
    wherein the generating of the bank select signal includes:
    generating bank low select signals in the bank select signal based on a reference clock; and
    generating bank high select signals in the bank select signal based on a clock that is obtained by inverting the reference clock.

11. The method of claim 10,
    wherein, in the outputting of the data to the memory controller, data that is stored in a memory device that corresponds to the data selector is output when the bank select signal is in a high state.

12. The method of claim 10,
    wherein, in the generating of the bank low select signals, the other bank low select signals are generated to be in a low state when any one of the bank low select signals is in a high state.

13. The method of claim 10,
wherein, in the generating of the bank low select signals, any one of the other bank low select signals is generated to be changed from a low state to a high state when any one of the bank low select signals is changed from the high state to the low state.

14. The method of claim 10,
wherein, in the generating of the bank high select signals, the other bank high select signals are generated to be in a low state when any one of the bank high select signals is in a high state.

15. The method of claim 10,
wherein, in the generating of the bank high select signals, any one of the other bank high select signals is generated to be changed from a low state to a high state when any one of the bank high select signals is changed from the high state to the low state.

16. The method of claim 10,
wherein, in the generating of the bank high select signals, any one of the bank high select signals is generated to be changed to a high state when a half period of the reference clock elapses after any one of the bank low select signals changes to be at the high state.

17. The method of claim 16,
wherein, in the generating of the bank low select signals, any one of the bank low select signals is generated to be changed to the high state when a half period of the reference clock elapses after any one of the bank high select signals changes to be at the high state.

18. The method of claim 16,
wherein, in the outputting of the data to the memory controller, data that is output from a memory device corresponding to any one of the bank low select signals is selected, is stored in the latch unit, and then is output to the memory controller, when the corresponding bank low select signal changes to be at the high state.

* * * * *